United States Patent
Tajima et al.

(10) Patent No.: US 6,709,804 B2
(45) Date of Patent: Mar. 23, 2004

(54) PRINTED WIRING BOARD AND SEMICONDUCTOR DEVICE AND PROCESSES TO PREPARE THE SAME

(75) Inventors: Yusuke Tajima, Asaka (JP); Kazuo Takeuchi, Higashikurume (JP); Yasuo Shigemitsu, Omiya (JP); Etsu Takeuchi, Soka (JP)

(73) Assignees: Riken, Wako (JP); Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 10/368,960

(22) Filed: Feb. 19, 2003

(65) Prior Publication Data

US 2003/0194621 A1 Oct. 16, 2003

Related U.S. Application Data

(62) Division of application No. 09/490,627, filed on Jan. 24, 2000, now Pat. No. 6,528,231.

(30) Foreign Application Priority Data

Jan. 25, 1999  (JP) .......................................... 1999/15176
May 26, 1999  (JP) ........................................ 1999/147097

(51) Int. Cl.[7] .............................. G03C 1/73; G03F 7/20; G03F 7/30
(52) U.S. Cl. ...................... 430/319; 430/311; 430/325; 430/326; 430/270.1; 430/281.1; 430/283.1; 430/288.1; 430/915; 430/920; 522/173; 522/31; 522/50; 522/53; 522/63; 522/70
(58) Field of Search ........................... 430/270.1, 281.1, 430/283.1, 288.1, 915, 920, 9, 311, 319, 18, 325, 326; 522/173, 31, 50, 53, 63, 70

(56) References Cited

U.S. PATENT DOCUMENTS

| | | | |
|---|---|---|---|
| 3,957,512 A | | 5/1976 | Kleeberg et al. |
| 4,243,743 A | | 1/1981 | Hiramoto et al. |
| 5,561,026 A | | 10/1996 | Aoki |
| 6,025,461 A | * | 2/2000 | Chiang et al. .............. 528/353 |

FOREIGN PATENT DOCUMENTS

| | | |
|---|---|---|
| JP | 54-145794 | 11/1979 |
| JP | 55-30207 | 8/1980 |
| JP | 57-168909 | * 10/1982 |
| JP | 59-108031 | 6/1984 |
| JP | 60-205454 | 10/1985 |
| JP | 6-167812 | 6/1994 |
| JP | 6-179802 | 6/1994 |
| JP | 8-283199 | 10/1996 |
| JP | 2814174 | 8/1998 |

OTHER PUBLICATIONS

Chemical Abstract 1983:430747—English abstract for JP 57–168909, 1982.*
Tajima et al. "Photo–Oxidation Induced Polycondensation Resin II" Journal of Photopolymer Science & Technology, vol. 12, No. 1 (1999) p. 125–128.*
Tajima et al., Chemical Abstract 1999:467436, *Journal of Photopolymer Science and Technology,* (1999), vol. 12 (1), pp. 125–128.
Enomoto et al., English Abstract (1986:177660) for Japanese document JP 60205454, published Oct. 17, 1985.

* cited by examiner

*Primary Examiner*—Janet Baxter
*Assistant Examiner*—Sin J. Lee
(74) *Attorney, Agent, or Firm*—Frishauf, Holtz, Goodman & Chick, P.C.

(57) ABSTRACT

A printed wiring board, a substrate for disposing semiconductor chips and a semiconductor device prepared by coating a substrate with a photosensitive resin composition comprising an oxygen sensitizer and a cis-diene-substituted polyamic acid or polyimide and forming fine patterns by exposure to radiation. Processes for producing a printed wiring board, a substrate for disposing semiconductor chips and a semiconductor device, which comprises coating a substrate with the photosensitive resin composition and forming fine patterns by crosslinking cis-diene by oxidation polycondensation with singlet oxygen generated by exposure of the oxygen sensitizer to radiation. The photosensitive resin composition is of the negative type and exhibits high sensitivity and high resolution. The photosensitive resin composition forms a resin layer having excellent heat resistance.

42 Claims, No Drawings

US 6,709,804 B2

PRINTED WIRING BOARD AND SEMICONDUCTOR DEVICE AND PROCESSES TO PREPARE THE SAME

This is a division of application Ser. No. 09/490,627 filed Jan. 24, 2000 U.S. Pat. No. 6,528,231.

BACKGROUND OF THE INVENTION

1. Field of the Invention

The present invention relates to a photosensitive resin composition, a printed wiring board, a substrate for disposing semiconductor chips, a semiconductor device and processes for producing a printed wiring substrate, a substrate for disposing semiconductor chips and a semiconductor device. More particularly, the present invention relates to a photosensitive resin composition of the negative type which can be applied to production of semiconductor elements and circuit wiring boards, can exhibit high sensitivity and high resolution and can form resin layers having excellent heat resistance; a printed wiring substrate, a substrate for disposing semiconductor chips and a semiconductor device obtained by using the photosensitive resin composition; and processes for producing a printed wiring substrate, a substrate for disposing semiconductor chips and a semiconductor device using the photosensitive resin composition.

2. Description of Related Art

As electronic instruments are recently used in portable forms, electronic instruments rapidly become lighter, thinner, shorter and smaller and have more advanced functions. Due to the above progress, semiconductor elements become smaller and more highly integrated. For example, in semiconductor circuits formed on semiconductor chips, the circuits themselves are more highly integrated, the circuits become finer due to the decrease in the size of packages and materials sealing the packages to protect chips become thinner. It is generally conducted that protecting layers such as passivation layers are used on circuits at the surface of chips to assure the reliability. To achieve further integration, circuits are formed in multi-layers with inter-layer insulation disposed between the layers.

With respect to semiconductor packages in which semiconductor chips are sealed, new packaging technologies which can achieve integration to high densities such as the ball grid array (BGA), the chip scale package (CSP) and the multi-chip module (MCM) have been developed. In these semiconductor packages, electric connection between electrodes in semiconductor chips and printed wiring boards is achieved by using interposers which are substrates constituted with various materials such as plastic and ceramics. Because the circuits formed on the substrates are introduced into the inside of semiconductors having decreased sizes, the circuits have much finer wiring and much higher degree of integration than those in conventional printed wiring circuits. Therefore, it is necessary that the fine circuits be protected by adopting the form of packaging. New technologies are developed also with respect to printed wiring boards to which these semiconductor packages are disposed. For example, in the build-up process, wiring layers are successively formed on a substrate with an insulation resin disposed between the layers to increase the density of wiring.

It is commonly required for these protecting resins and inter-layer insulation resins that the resins have high heat resistance so that the resin can withstand temperatures as high as 200 to 300° C. during bonding and disposing chips and workability in formation of holes so that electric conductivity is provided at junctions of wirings and between insulation layers. In particular, with respect to protecting films for interposers and inter-layer insulation films for circuit boards formed in accordance with the build-up process which must be worked on substrates, it is required that the resins have workability at low temperatures so that the working does not cause damage to the substrates.

Heretofore, polyimides have been used for applications which require heat resistance such as protecting films of semiconductor chips and epoxy resins have been used for applications which require working at low temperatures such as protecting films on circuit substrates and inter-layer insulation films. For pattern working such as formation of holes suitable for highly integrated circuit wiring, it is advantageous that the patterns are formed by utilizing the photomechanical process (the photographic process), i.e., by using photosensitive resins such as heat resistant photosensitive polyimide and epoxy resins.

As for the polyimide resins, photosensitive polyimides have been developed and used (for example, Japanese Patent Application Publication Showa 55(1980)-30207 and Japanese Patent Application Laid-Open No. Showa 54(1979)-145794). In general, these photosensitive polyimides form crosslinked structures by photoradical polymerization of (metha)acrylates introduced into the carboxyl group of polyamic acid which is used as the precursor of the polyimide. Pattern working such as formation of holes is conducted by utilizing the difference in solubility into developer between crosslinked area and uncrosslinked area. When the above polyamic acid is converted into a polyimide, it is necessary that the (metha)acryloyl group bonded to the carboxyl group be removed. Therefore, the ring closure for forming such an imide structure from the polyamic acid requires stronger heating than that required for the ring closure for forming conventional polyimides. Moreover, because the properties of the polyimide such as heat resistance and mechanical properties are markedly deteriorated when the removed (metha)acrylate fragment is left remaining in the polyimide, the removed (metha)acrylate fragment must be decomposed and vaporized at high temperature in order that the polyimide can exhibit the excellent characteristic properties thereof Thus, it is necessary that the photosensitive polyimides be worked at temperatures still higher than those for conventional polyimides. To overcome the problem of working at high temperatures, it has been proposed that (metha)acrylate moiety are incorporated into side chains of polyimides which has been treated by ring closure in advance so that low temperature workability is excellent (Japanese Patent Application Laid-Open No. Showa 59(1984)-108031 and the like other applications). However, the (metha)acrylate moiety are left remaining in these resins after working and the properties such as heat resistance deteriorate.

As for the epoxy resins, various types of photosensitive epoxy resins are actually used as solder resists for protection of circuit wirings and resins for inter-layer insulation for the build-up process. However, no epoxy resins exhibit satisfactory properties such as heat resistance and flexibility to follow deformation of thinner substrates contained in thinner packages.

As the photosensitive material composition advantageously used for resists exhibiting high resolution and high sensitivity, a photosensitive material composition comprising a fullerene without photosensitive groups and a photosensitive agent such as a diazide compound has been proposed (Japanese Patent No. 2814174). However, this composition has drawbacks in that the solution of the composition has low viscosity because the composition is composed of a fullerene and a low molecular weight diazide so it is difficult to coat an uniform film having a sufficient thickness. And the coating film formed by polymerization and crosslinking between the fullerene and the diazide has inferior mechanical strength and poor heat resistance. Moreover, that a fullerene which is very expensive at the present time is used in an amount five folds as much as the amount of the diazide to cause economic disadvantage.

SUMMARY OF THE INVENTION

An object of the present invention is to provide a photosensitive resin composition of the negative type which can be applied to production of semiconductor elements and circuit wiring boards, exhibits high sensitivity and high resolution and can form resin layers having excellent heat resistance; a printed wiring board, a substrate for disposing semiconductor chips and a semiconductor device using the photosensitive resin composition; and processes for producing a printed wiring board, a substrate for disposing semiconductor chips and a semiconductor device using the photosensitive resin composition.

As the result of extensive studies by the present inventors to overcome the above problems, it was found that a photosensitive resin composition having remarkably improved photosensitivity and heat resistance can be obtained by using a polyamic acid or polyimide having a cis-diene structure at side chains in combination with an oxygen sensitizer and that a resin layer having excellent heat resistance can be formed by forming a layer of the photosensitive resin composition, applying radiation to the oxygen sensitizer and crosslinking the cis-diene group by following oxidation polycondensation with singlet oxygen generated by exposure of radiation to the oxygen sensitizer in the presence of oxygen. The present invention has been completed based on this knowledge.

The present invention provides:

(1) A photosensitive resin composition which comprises an oxygen sensitizer and a cis-diene-substituted polyamic acid or polyimide having a structural unit represented by general formula [1]:

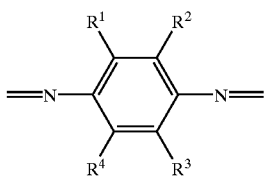

[1]

wherein at least one of $R^1$, $R^2$, $R^3$ and $R^4$ represents a monovalent organic group having a cis-diene structure; and the rest of $R^1$, $R^2$, $R^3$ and $R^4$ each independently represents hydrogen, hydroxyl group, carboxyl group, an alkyl group having 1 to 20 carbon atoms or an alkoxy group having 1 to 20 carbon atoms;

(2) A photosensitive resin composition which comprises an oxygen sensitizer and a cis-diene-substituted polyamic acid or polyimide having a structural unit represented by general formula [2]:

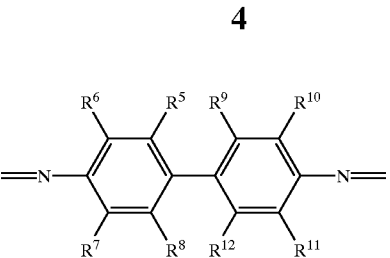

[2]

wherein at least one of $R^5$, $R^6$, $R^7$, $R^8$, $R^9$, $R^{10}$, $R^{11}$ and $R^{12}$ represents a monovalent organic group having a cis-diene structure; and the rest of $R^5$, $R^6$, $R^7$, $R^8$, $R^9$, $R^{10}$, $R^{11}$ and $R^{12}$ each independently represents hydrogen, hydroxyl group, carboxyl group, an alkyl group having 1 to 20 carbon atoms or an alkoxy group having 1 to 20 carbon atoms;

(3) A photosensitive resin composition which comprises an oxygen sensitizer and a cis-diene-substituted polyamic acid or polyimide having a structural unit represented by general formula [3]:

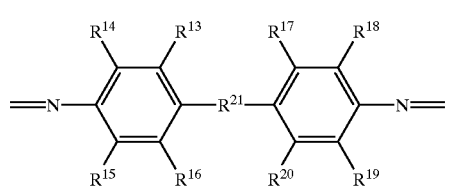

[3]

wherein at least one of $R^{13}$, $R^{14}$, $R^{15}$, $R^{16}$, $R^{17}$, $R^{18}$, $R^{19}$ and $R^{20}$ represents a monovalent organic group having a cis-diene structure; the rest of $R^{13}$, $R^{14}$, $R^{15}$, $R^{16}$, $R^{17}$, $R^{18}$, $R^{19}$ and $R^{20}$ each independently represents hydrogen, hydroxyl group, carboxyl group, an alkyl group having 1 to 20 carbon atoms or an alkoxy group having 1 to 20 carbon atoms; and $R^{21}$ represents oxygen, sulfur or an alkylene group, an alkylidene group or an alkyleneoxy group having 1 to 4 carbon atoms;

(4) A photosensitive resin composition which comprises an oxygen sensitizer and a cis-diene-substituted polyamic acid or polyimide having a structural unit represented by general formula [4]:

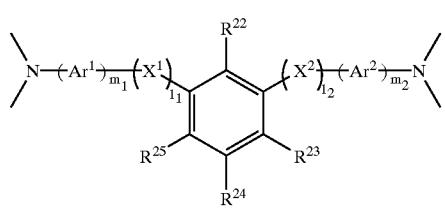

[4]

wherein at least one of $R^{22}$, $R^{23}$, $R^{24}$ and $R^{25}$ represents a monovalent organic group having a cis-diene structure; the rest of $R^{22}$, $R^{23}$, $R^{24}$ and $R^{25}$ each independently represents hydrogen, hydroxyl group, carboxyl group, an alkyl group having 1 to 20 carbon atoms or an alkoxy group having 1 to 20 carbon atoms; $X^1$ and $X^2$ each independently represents oxygen, sulfur or an alkylene group, an alkylidene group or an alkyleneoxy group which each has 1 to 4 carbon atoms and may have substituents; $Ar^1$ and $Ar^2$ each independently represents a divalent aromatic group; and $l_1$, $l_2$, $m_1$ and $m_2$ each independently represents 0 or 1 except that $m_1$ represents 1 when $l_1$ represents 1 and $m_2$ represents 1 when $l_2$ represents 1;

(5) A photosensitive resin composition which comprises an oxygen sensitizer and a cis-diene-substituted polyamic acid or polyimide having a structural unit represented by general formula [5]:

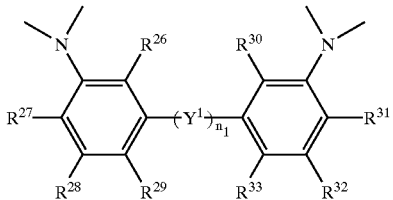

wherein at least one of $R^{26}$, $R^{27}$, $R^{28}$, $R^{29}$, $R^{30}$, $R^{31}$, $R^{32}$ and $R^{33}$ represents a monovalent organic group having a cis-diene structure; the rest of $R^{26}$, $R^{27}$, $R^{28}$, $R^{29}$, $R^{30}$, $R^{31}$, $R^{32}$ and $R^{33}$ each independently represents hydrogen atom, hydroxyl group, carboxyl group, an alkyl group having 1 to 20 carbon atoms or an alkoxy group having 1 to 20 carbon atoms; $Y^1$ represents oxygen, sulfur or an alkylene group, an alkylidene group or an alkyleneoxy group which each has 1 to 4 carbon atoms and may have substituents; and $n_1$ represents 0 or 1;

(6) A photosensitive resin composition described in any of (1), (2), (3), (4) and (5), wherein the cis-diene structure is a cyclopentadiene, furan, thiophene or pyrrole structure;

(7) A photosensitive resin composition described in any of (1), (2), (3), (4), (5) and (6), wherein the oxygen sensitizer is a fullerene;

(8) A printed wiring board which is prepared by coating a printed wiring substrate with a photosensitive resin composition described in any of (1), (2), (3), (4), (5), (6) and (7), and forming fine patterns by exposure of radiation;

(9) A substrate for disposing semiconductor chips which is prepared by coating a printed wiring substrate with a photosensitive resin composition described in any of (1), (2), (3), (4), (5), (6) and (7), and forming fine patterns by exposure of radiation;

(10) A semiconductor device which is prepared by coating a substrate on which semiconductor chips are disposed with a photosensitive resin composition described in any of (1), (2), (3), (4), (5), (6) and (7), and forming fine patterns by exposure of radiation;

(11) A process for producing a printed wiring board which comprises coating a printed wiring substrate with a photosensitive resin composition described in any of (1), (2), (3), (4), (5), (6) and (7), and forming fine patterns by crosslinking the cis-diene group by following oxidation polycondensation with singlet oxygen generated by exposure of radiation to the oxygen sensitizer in the presence of oxygen;

(12) A process for producing a substrate for disposing semiconductor chips which comprises coating a printed wiring substrate with a photosensitive resin composition described in any of (1), (2), (3), (4), (5), (6) and (7), and forming fine patterns by crosslinking the cis-diene group by polycondensation with oxidation with singlet oxygen generated by exposure of radiation to the oxygen sensitizer; and

(13) A process for producing a semiconductor device which comprises coating the surface for forming a conductive circuit of a substrate on which semiconductor chips are disposed with a photosensitive resin composition described in any of (1), (2), (3), (4), (5), (6) and (7), and forming fine patterns by crosslinking the cis-diene group by polycondensation with oxidation with singlet oxygen generated by exposure of radiation to the oxygen sensitizer.

The preferable embodiments of the present invention include:

(14) A photosensitive resin composition described in (1), wherein the content of the structural unit represented by formula [1] is 30% by mol or more of the total diamine units;

(15) A photosensitive resin composition described in (2), wherein the content of the structural unit represented by formula [2] is 30% by mol or more of the total diamine units;

(16) A photosensitive resin composition described in (3), wherein the content of the structural unit represented by formula [3] is 30% by mol or more of the total diamine units;

(17) A photosensitive resin composition described in (4), wherein the content of the structural unit represented by formula [4] is 30% by mol or more of the total diamine units;

(18) A photosensitive resin composition described in (5), wherein the content of the structural unit represented by formula [5] is 30% by mol or more of the total diamine units;

(19) A photosensitive resin composition described in any of (1), (2), (3), (4) and (5), wherein the molecular weight of the polyamic acid or the polyimide is 5,000 or greater; and

(20) A photosensitive resin composition described in any of (1), (2), (3), (4) and (5), wherein the amount of the oxygen sensitizer is 0.01 to 20 parts by weight per 100 parts by weight of the polyamic acid or the polyimide.

DESCRIPTION OF THE PREFERRED EMBODIMENTS

The first embodiment of the photosensitive resin composition of the present invention is the composition which comprises an oxygen sensitizer and a cis-diene-substituted polyamic acid or polyimide having a structural unit represented by general formula [1]:

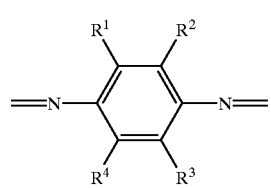

In general formula [1], at least one of $R^1$, $R^2$, $R^3$ and $R^4$ represents a monovalent organic group having a cis-diene structure; and the rest of $R^1$, $R^2$, $R^3$ and $R^4$ each independently represents hydrogen, hydroxyl group, carboxyl group, an alkyl group having 1 to 20 carbon atoms or an alkoxy group having 1 to 20 carbon atoms.

The second embodiment of the photosensitive resin composition of the present invention is the composition which comprises an oxygen sensitizer and a cis-diene-substituted polyamic acid or polyimide having a structural unit represented by general formula [2]:

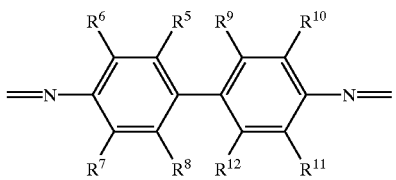

In general formula [2], at least one of $R^5$, $R^6$, $R^7$, $R^8$, $R^9$, $R^{10}$, $R^{11}$ and $R^{12}$ represents a monovalent organic group having a cis-diene structure; and the rest of $R^5$, $R^6$, $R^7$, $R^8$, $R^9$, $R^{10}$, $R^{11}$ and $R^{12}$ each independently represents hydrogen, hydroxyl group, carboxyl group, an alkyl group having 1 to 20 carbon atoms or an alkoxy group having 1 to 20 carbon atoms.

The third embodiment of the photosensitive resin composition of the present invention is the composition which comprises an oxygen sensitizer and a cis-diene-substituted polyamic acid or polyimide having a structural unit represented by general formula [3]:

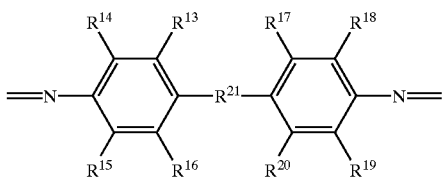

In general formula [3], at least one of $R^{13}$, $R^{14}$, $R^{15}$, $R^{16}$, $R^{17}$, $R^{18}$, $R^{19}$ and $R^{20}$ represents a monovalent organic group having a cis-diene structure; the rest of $R^{13}$, $R^{14}$, $R^{15}$, $R^{16}$, $R^{17}$, $R^{18}$, $R^{19}$ and $R^{20}$ each independently represents hydrogen, hydroxyl group, carboxyl group, an alkyl group having 1 to 20 carbon atoms or an alkoxy group having 1 to 20 carbon atoms; and $R^{21}$ represents oxygen, sulfur or an alkylene group, an alkylidene group or an alkyleneoxy group having 1 to 4 carbon atoms.

The fourth embodiment of the photosensitive resin composition of the present invention is the composition which comprises an oxygen sensitizer and a cis-diene-substituted polyamic acid or polyimide having a structural unit represented by general formula [4]:

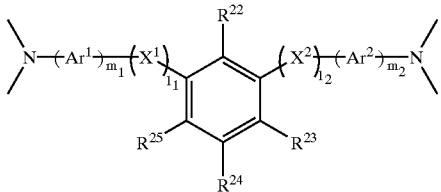

In general formula [4], at least one of $R^{22}$, $R^{23}$, $R^{24}$ and $R^{25}$ represents a monovalent organic group having a cis-diene structure; the rest of $R^{22}$, $R^{23}$, $R^{24}$ and $R^{25}$ each independently represents hydrogen, hydroxyl group, carboxyl group, an alkyl group having 1 to 20 carbon atoms or an alkoxy group having 1 to 20 carbon atoms; $X^1$ and $X^2$ each independently represents oxygen, sulfur or an alkylene group, an alkylidene group or an alkyleneoxy group which each has 1 to 4 carbon atoms and may have substituents; $Ar^1$ and $Ar^2$ each independently represents a divalent aromatic group; and $l_1$, $l_2$, $m_1$ and $m_2$ each independently represents 0 or 1 except that $m_1$ represents 1 when $l_1$ represents 1 and $m_2$ represents 1 when $l_2$ represents 1.

The fifth embodiment of the photosensitive resin composition of the present invention is the composition which comprises an oxygen sensitizer and a cis-diene-substituted polyamic acid or polyimide having a structural unit represented by general formula [5]:

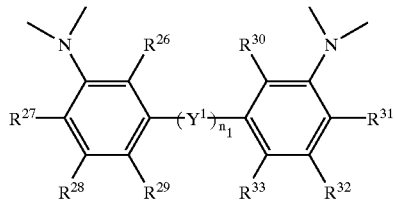

In general formula [5], at least one of $R^{26}$, $R^{27}$, $R^{28}$, $R^{29}$, $R^{30}$, $R^{31}$, $R^{32}$ and $R^{33}$ represents a monovalent organic group having a cis-diene structure; the rest of $R^{26}$, $R^{27}$, $R^{28}$, $R^{29}$, $R^{30}$, $R^{31}$, $R^{32}$ and $R^{33}$ each independently represents hydrogen atom, hydroxyl group, carboxyl group, an alkyl group having 1 to 20 carbon atoms or an alkoxy group having 1 to 20 carbon atoms; $Y^1$ represents oxygen, sulfur or an alkylene group, an alkylidene group or an alkyleneoxy group which has 1 to 4 carbon atoms and may have substituents; and $n_1$ represents 0 or 1.

In the fourth and fifth embodiments of the composition of the present invention, the cis-diene-substituted polyamic acid or polyimide having the structural unit represented by general formula [4] and [5], respectively, are characterized in that the main chain is bonded to the meta-positions of an aromatic ring substituted with a monovalent organic group having the cis-diene structure. When the main chain is bonded to the meta-positions of the aromatic ring, molecular packing such as crystallinity of the polyamic acid or the polyimide tends to decrease. In particular, the resin having the cis-diene structure shows improved solubility in a developer. As the result, when optical patterns are formed, the difference in solubility into a developer between unexposed portions which should be dissolved into the developer and exposed portions which are crosslinked is remarkably exhibited. Therefore, the ability to form patterns is remarkably improved in that excellent contrast is exhibited by exposure to a small amount of light, resin patterns having excellent shapes are easily obtained and resins of the unexposed portions can be removed completely.

In the composition of the present invention, the polyamic acid or the polyimide may have a single type of the structural unit represented by any of general formulae [1] to [5] or two or more types of such structural units in the form of a copolymer. The composition of the present invention may comprise a single type or a mixture of two or more types of the cis-diene-substituted polyamic acids or polyimides having the structural units represented by general formulae [1] to [5]. The composition of the present invention may be a mixture of the cis-diene-substituted polyamic acids or polyimides having the structural units represented by general formulae [1] to [5] and polyamic acids or polyimides having no structural units represented by general formulae [1] to [5].

Examples of the monovalent organic group having a cis-diene structure in general formulae [1] to [5] include —$CH_2$—CO-D, —O—CO-D, —CO—O—$CH_2$D, —$CH_2$O—$CH_2$-D, —O—$CH_2$-D, —NH—CO-D and —CO—NH—$CH_2$-D. D represents a cis-diene structure. Examples of the cis-diene structure represented by D include cyclopentadienyl group, furyl group, pyrrolyl group, thienyl group, 2,4-pyranyl group, isobenzofuranyl group, indolydinyl group and quinolidinyl group. Among these groups, cyclopentadienyl group, furyl group, thienyl group and pyrrolyl group are preferable.

In general formulae [1] to [5], examples of the alkyl group having 1 to 20 carbon atoms include methyl group, ethyl group, butyl group, pentyl group, hexyl group, heptyl group, octyl group, decyl group and lauryl group. Among these groups, methyl group, ethyl group, propyl group, butyl group and pentyl group are preferable.

In general formulae [1] to [5], examples of the alkoxy group having 1 to 20 carbon atoms include methoxy group, ethoxy group, propoxy group, butoxy group, pentyloxy group, hexyloxy group, lauryloxy group and phenoxy group. Among these groups, methoxy group, ethoxy group, butoxy group and pentyloxy group are preferable.

In general formulae [3] to [5], examples of the alkylene group having 1 to 4 carbon atoms include methylene group, ethylene group, propylene group, isopropylidene group and butylene group. Examples of the alkyleneoxy group having 1 to 4 carbon atoms include methyleneoxy group, ethyleneoxy group, propyleneoxy group and butyleneoxy group.

The process for producing the cis-diene-substituted polyamic acids and polyimides having structural units represented by general formulae [1] to [5] which are used in the present invention is not particularly limited. For example, the polyamic acid and the polyimide can be produced by using a diamine represented by one of general formulae [6] to [10] and a dianhydride of a polycarboxylic acid as the materials.

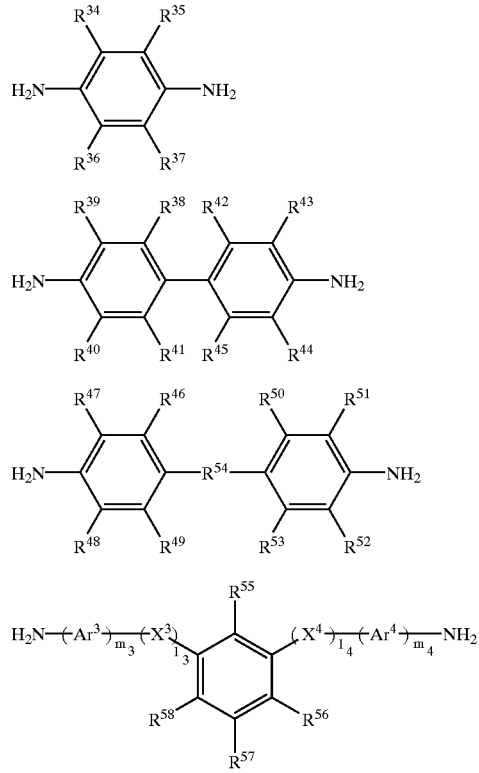

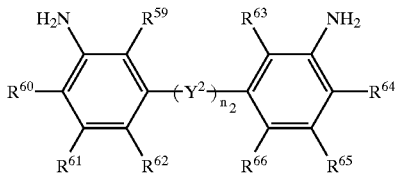

In general formula [6], at least one of $R^{34}$, $R^{35}$, $R^{36}$ and $R^{37}$ represents hydroxyl group; and the rest of $R^{34}$, $R^{35}$, $R^{36}$ and $R^{37}$ each independently represents hydrogen, carboxyl group, an alkyl group having 1 to 20 carbon atoms or an alkoxy group having 1 to 20 carbon atoms.

In general formula [7], at least one of $R^{38}$, $R^{39}$, $R^{40}$, $R^{41}$, $R^{42}$, $R^{43}$, $R^{44}$ and $R^{45}$ represents hydroxyl group; and the rest of $R^{38}$, $R^{39}$, $R^{40}$, $R^{41}$, $R^{42}$, $R^{43}$, $R^{44}$ and $R^{45}$ each independently represents hydrogen, carboxyl group, an alkyl group having 1 to 20 carbon atoms or an alkoxy group having 1 to 20 carbon atoms.

In general formula [8], at least one of $R^{46}$, $R^{47}$, $R^{48}$, $R^{49}$, $R^{50}$, $R^{51}$, $R^{52}$ and $R^{53}$ represents hydroxyl group; the rest of $R^{46}$, $R^{47}$, $R^{48}$, $R^{49}$, $R^{50}$, $R^{51}$, $R^{52}$ and $R^{53}$ each independently represents hydrogen, carboxyl group, an alkyl group having 1 to 20 carbon atoms or an alkoxy group having 1 to 20 carbon atoms; and $R^{54}$ represents oxygen, sulfur, an alkylene group, an alkylidene group or an alkyleneoxy group having 1 to 4 carbon atoms.

In general formula [9], at least one of $R^{55}$, $R^{56}$, $R^{57}$ and $R^{58}$ represents hydroxyl group, hydroxymethyl group or carboxyl group; the rest of $R^{55}$, $R^{56}$, $R^{57}$ and $R^{58}$ each independently represents hydrogen, an alkyl group having 1 to 20 carbon atoms or an alkoxy group having 1 to 20 carbon atoms; $X^3$ and $X^4$ each independently represents oxygen, sulfur or an alkylene group, an alkylidene group or an alkyleneoxy group which each has 1 to 4 carbon atoms and may have substituents; $Ar^3$ and $Ar^4$ each independently represents a divalent aromatic group; and $l_3$, $l_4$, $m_3$ and $m_4$ each independently represents 0 or 1 except that $m_3$ represents 1 when $l_3$ represents 1 and $m_4$ represents 1 when $l_4$ represents 1.

In general formula [10], at least one of $R^{59}$, $R^{60}$, $R^{61}$, $R^{62}$, $R^{63}$, $R^{64}$, $R^{65}$ and $R^{66}$ represents hydroxyl group, hydroxymethyl group or carboxyl group; the rest of $R^{59}$, $R^{60}$, $R^{61}$, $R^{62}$, $R^{63}$, $R^{64}$, $R^{65}$ and $R^{66}$ each independently represents hydrogen, an alkyl group having 1 to 20 carbon atoms or an alkoxy group having 1 to 20 carbon atoms; $Y^2$ represents oxygen, sulfur or an alkylene group, an alkylidene group or an alkyleneoxy group which each has 1 to 4 carbon atoms and may have a substituent; and $n_2$ represents 0 or 1. Atoms substituting hydrogen such as chlorine are included in the substituent.

Examples of the diamine represented by general formula [6] include 2-hydroxy-3-methyl-1,4-phenylenediamine and the like. Examples of the diamine represented by general formula [7] include 2,2'-dihydroxy-3,3'-dimethyl-4,4'-diaminobiphenyl and the like. Examples of the diamine represented by general formula [8] include 2,2-bis(3-hydroxy-4-aminophenyl)propane and the like. Examples of the diamine represented by general formula [9] include 3,5-diaminobenzyl alcohol, 3,5-diaminophenol and 3,5-diaminobenzoic acid. Examples of the diamine represented by general formula [10] include 3,3'-diamino-4,4'-dihydroxybiphenyl, 2,2-bis(3-amino-4-hydroxyphenyl) hexafluoropropane and 3,5-bis(4-aminophenoxy)benzyl alcohol.

In the present invention, the dianhydride of a polycarboxylic acid which is reacted with the diamines represented by general formulae [6] to [10] is not particularly limited. Examples of the dianhydride of a polycarboxylic acid include pyromellitic dianhydride, prehnitic dianhydride, 3,3',4,4'-benzophenonetetracarboxylic dianhydride, 3,3',14,4'-biphenyltetracarboxylic dianhydride, 4,4'-hexafluoroisopropylidene-diphthalic anhydride, benzenepentacarboxylic dianhydride and mellitic dianhydride. Among these compounds, 4,4'-hexafluoroisopropylidene-diphthalic dianhydride is preferably used.

In the present invention, the process for reacting the diamines represented by general formulae [6] to [10] with the dianhydride of a polycarboxylic acid is not particularly limited. The polyamic acid can be synthesized in accordance with a conventional process of polymerization. For example, a polyamic acid having a structural unit represented by general formula [11] can be obtained by reacting a diamine represented by general formula [6] with pyromellitic dianhydride in a solvent such as N-methyl-2-pyrrolidone at the room temperature. A polyimide having a structural unit represented by general formula [12] can be obtained by the ring closure reaction with dehydration of the polyamic acid having a structural unit represented by general formula [11]. A polyamic acid having a structural unit represented by general formula [13] can be obtained by reacting a diamine represented by general formula [9] with pyromellitic dianhydride in a solvent such as N-methyl-2-pyrrolidone. A polyimide having a structural unit represented by general formula [14] can be obtained by the ring closure reaction with dehydration of the polyamic acid having a structural unit represented by general formula [13].

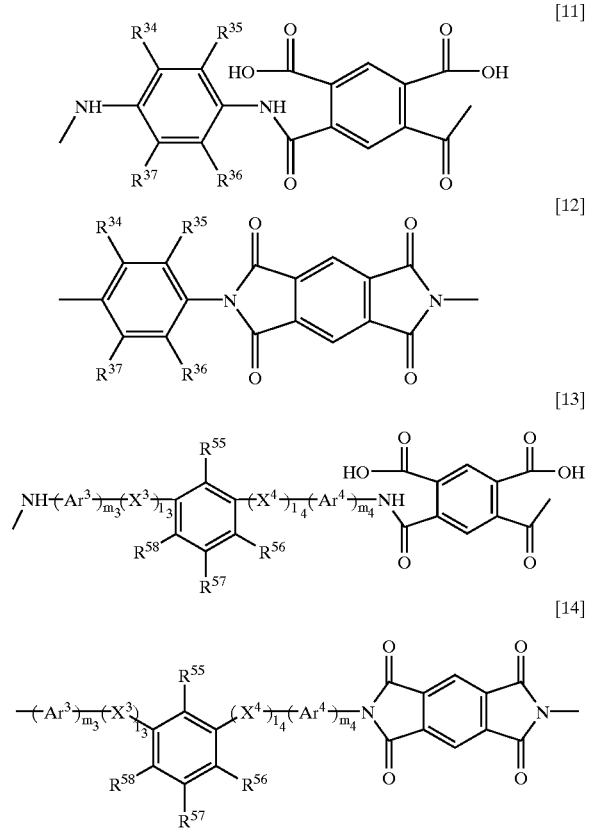

The process for incorporating a monovalent organic group having a cis-diene structure into the polyamic acid having a structural unit represented by general formula [11] or [13] or into the polyimide having a structural unit represented by general formula [12] or [14] is not particularly limited. For example, a monovalent organic group having a cis-diene structure can be incorporated into hydroxyl group of the polyamic acid having a structural unit represented by general formula [11] or [13] or the polyimide having a structural unit represented by general formula [12] or [14] by reacting a halogenated compound having the cis-diene structure in the presence of a base. When, in general formula [11], $R^{34}$ represents methyl group, $R^{35}$ represents hydroxyl group, $R^{36}$ and $R^{37}$ each represents hydrogen and the halogenated compound having the cis-diene structure is furfuryl bromide, the polyamic acid having a structural unit represented by the formula [15] can be obtained. When, in general formula [13], $R^{57}$ represents hydroxyl group, $R^{55}$, $R^{56}$ and $R^{58}$ each represents hydrogen and the halogenated compound having the cis-diene structure is furfuryl bromide, the polyamic acid having a structural unit represented by general formula [16] can be obtained.

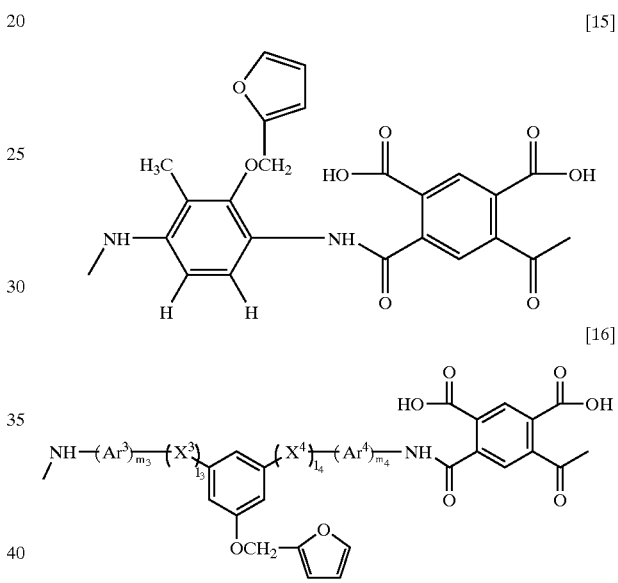

In the present invention, as the process for producing the cis-diene-substituted polyamic acids having a structural units represented by general formulae [1] to [5], a diamine having hydroxyl group can be reacted with a dianhydride of a polycarboxylic acid and then an organic group having a cis-diene structure can be incorporated into the obtained product, as described above. Alternatively, for example, a diamine having an organic group having a cis-diene structure may be reacted with a dianhydride of a polycarboxylic acid. Examples of the diamine having an organic group having a cis-diene structure include 2,5-diamino-6-furfuryloxytoluene, 3,3'-difurfuryloxy-4,4'-diaminobiphenyl, 2,2-bis(3-furfuryloxy-4-aminophenyl)propane, 3,5-diaminobenzyl-2-furoate, 1,1,1,3,3,3-hexafluoro-2,2-bis(3-amino-4-furfuryloxyphenyl)propane, 3,3'-diamino-4,4'-di(2-furoylamino)biphenyl and 3,3'-diamino-4,4'-difurfuryloxybiphenyl. The above diamines can be obtained, for example, by reacting an aromatic dinitro compound having hydroxyl group, carboxyl group or a hydroxyalkyl group with a halogenated compound having a cis-diene structure such as furfuryl bromide in the presence of a base, followed by reducing the nitro group in the product. The process for reducing nitro group is not particularly limited. Examples of the process for reducing nitro group include reduction with hydrazine, catalytic hydrogenation reaction in the presence of a transition metal catalyst such as nickel, palladium and platinum and reduction with an aqueous solution of indium and ammonium chloride.

In the composition of the present invention, examples of the structural unit represented by general formula [4] include structural units expressed by the following formulae [4-(1)] to [4-(20)] and examples of the structural unit represented by general formula [5] include structural units expressed by the following formulae [5-(1)] to [5-(10)].

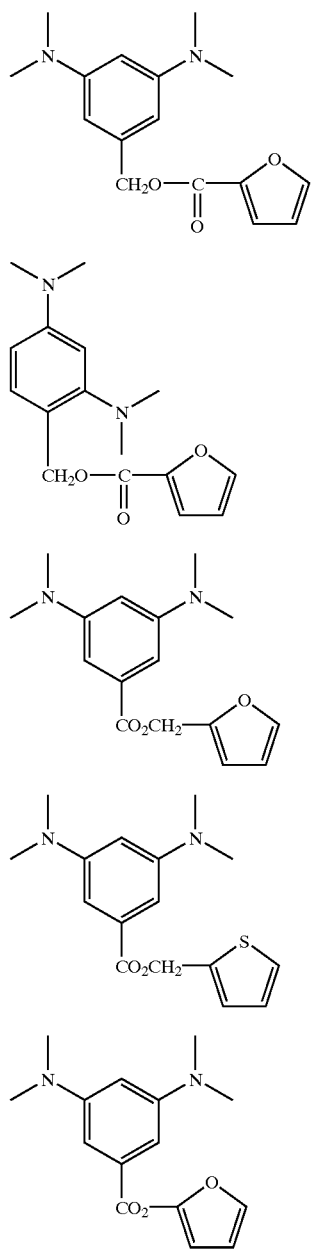

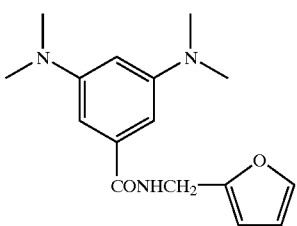

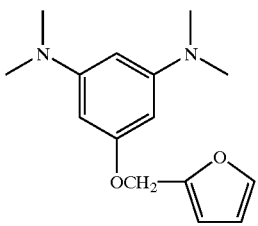

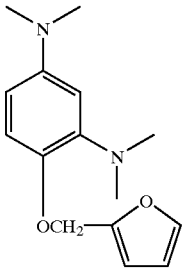

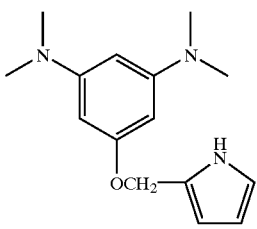

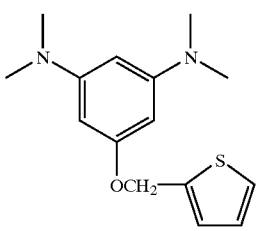

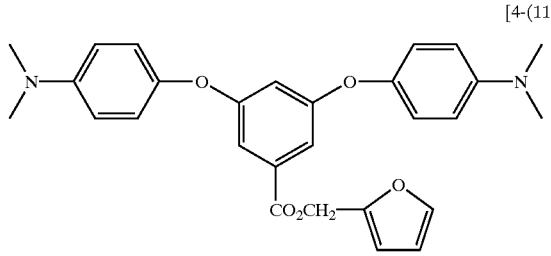

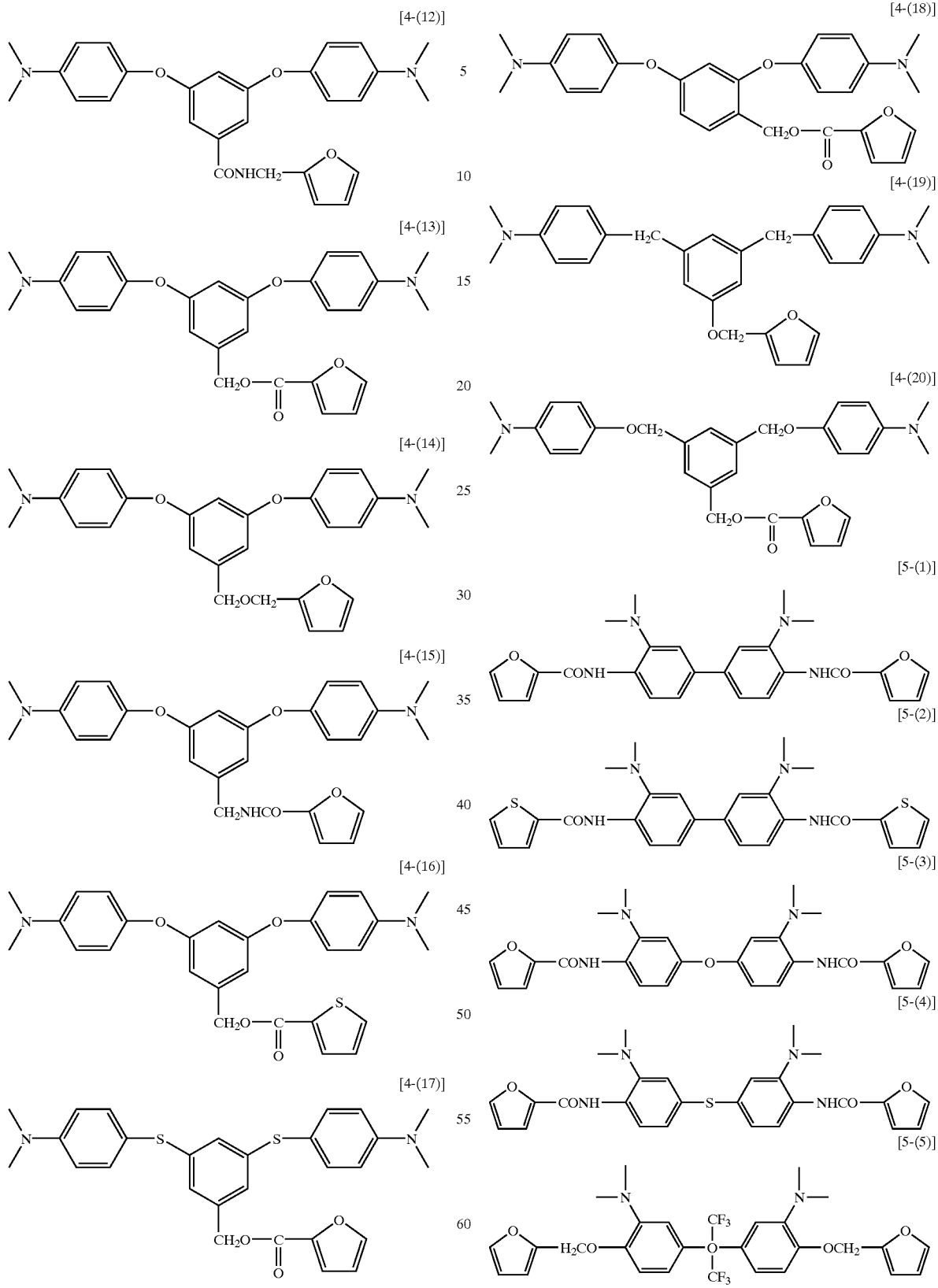

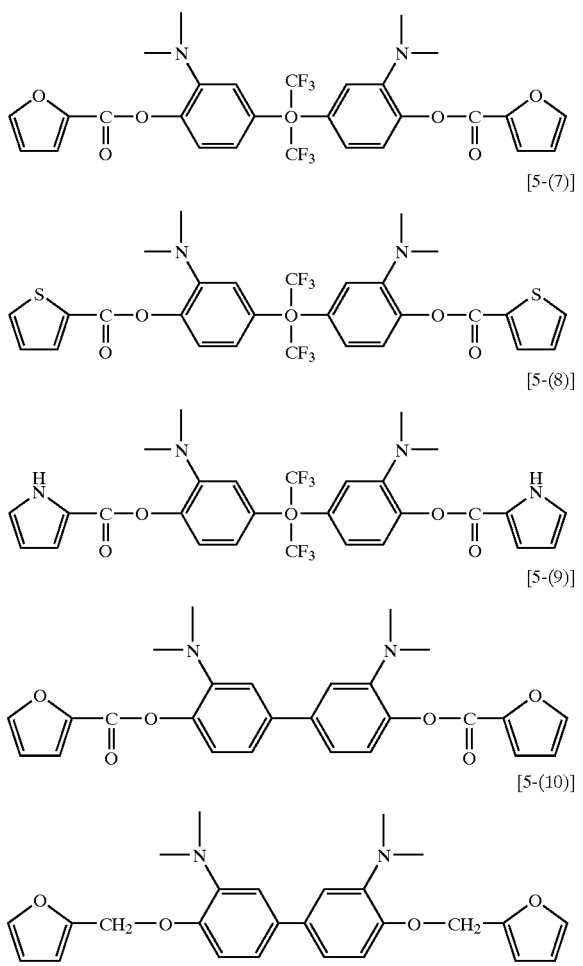

In the composition of the present invention, it is preferable that the amount of the structural units represented by general formulae [1] to [5] is 30% by mol or more, more preferably 50% by mol or more and most preferably 60% by mol or more of the total amount of the diamine structural units. When the amount of the structural units represented by general formulae [1] to [5] is less than 30% by mol of the total amount of the diamine structural units, there is the possibility that the curing property of the photosensitive resin composition deteriorates. In the present invention, it is preferable that the molecular weight of the cis-diene-substituted polyamic acids and polyimides having structural units represented by general formulae [1] to [5] are 5,000 or greater, more preferably 10,000 to 1,000,000 and most preferably 50,000 to 200,000. When the molecular weight of the polyamic acids and the polyimides are smaller than the above value, there is the possibility that obtaining a uniform film becomes difficult. When the molecular weight of the polyamic acids and the polyimides are excessively great, there is the possibility that solubility decreases and forming a uniform film becomes difficult.

The cis-diene-substituted polyamic acids and polyimides having the structural units represented by general formulae [1] to [5], which are used in the composition of the present invention, are soluble in solvents or alkaline aqueous solutions. The polyamic acids and the polyimides easily react with the singlet oxygen generated by the effect of the oxygen sensitizer and intermediates of polyamic acids and the polyimides, respectively, having a peroxide group are formed. The formed intermediates immediately react with the adjacent polyamic acids and the polyimides, respectively, induce crosslinking between each other by polycondensation and remarkably increase the molecular weight. Due to this reaction, the polyamic acids and the polyimides become insoluble. The polyamic acids and the polyimides crosslinked by the polycondensation show remarkably improved heat resistance. Unlike conventional photosensitive polyimides which are crosslinked by the radical reaction, the photosensitive resin composition of the present invention is crosslinked by polycondensation with oxidation of the cis-diene structure by the singlet oxygen. Therefore, the reaction is not adversely affected by oxygen in the air and the crosslinked resin has excellent heat resistance.

The oxygen sensitizer used for the composition of the present invention is not particularly limited. It is preferable that the oxygen sensitizer has an excited triplet energy of 22.5 kcal/mol or more. Examples of the oxygen sensitizer include methylene blue, rose bengal, hematoporphyrin, tetraphenylporphine, rubrene, fullerene C60, fullerene C70 and fullerene C82. The oxygen sensitizer may be used singly or as a combination of two or more types. Among these oxygen sensitizers, fullerene C60 and fullerene C70 are preferably used.

In the composition of the present invention, the amount of the oxygen sensitizer is not particularly limited. It is preferable that the amount of the oxygen sensitizer is 0.01 to 20 parts by weight and more preferably 0.1 to 10 parts by weight per 100 parts by weight of the cis-diene-substituted polyamic acid or polyimide having a structural unit represented by any of general formulae [1] to [5]. When the amount of the oxygen sensitizer is less than the above range, there is the possibility that the sensitizing effect becomes insufficient. When the amount of the oxygen sensitizer is more than the above range, economic disadvantage arises and there is the possibility that forming a uniform film in accordance with spin coating or bar coating becomes difficult. The composition of the present invention which comprises the high molecular weight cis-diene-substituted polyamic acid or polyimide and the oxygen sensitizer has a suitable viscosity when the composition is used as a solution and can be applied to silicon wafers uniformly to a necessary thickness by a spin coater, a bar coater or a curtain coater. Because the resin layer is formed by crosslinking the high molecular weight cis-diene-substituted polyamic acid or polyimide in the composition, the formed resin layer has excellent strength and heat resistance. The expensive oxygen sensitizer such as fullerenes is used in a relatively small amount and the resin layer can be formed economically advantageously.

The method of application of the photosensitive resin composition of the present invention is not particularly limited. In general, the photosensitive resin composition is applied to a substrate, worked to form patterns by light exposure and development and then, where necessary, heat cured to form a resin layer. The method of forming the coating film is not particularly limited. Examples of the method of forming the coating film include a method in which varnish obtained by dissolving the photosensitive resin composition into a solvent is directly applied to a substrate in accordance with spin coating, bar coating or curtain coating and the formed layer is dried under a mild condition or a method in which a varnish obtained by dissolving the photosensitive resin composition into a solvent is applied to a releasing substrate made of a plastic sheet or a sheet of a metal such as stainless steel and dried under a mild condition to prepare a material for coating and then the layer on the prepared material for coating is transferred to a substrate by lamination with pressure.

The wave length of the radiation applied to the composition of the present invention can be suitably selected in accordance with the used oxygen sensitizer. For example, when fullerene C60 is used as the oxygen sensitizer, radiation having a wide range of wave length such as light of ultraviolet region to visible region (250 to 780 nm), X-ray and electron beams can be used. The exposure can be conducted by irradiating the light to the coating film through a mask which can shield area of the formed coating film where the resin composition will be removed. After the exposure, the development can be conducted by using an organic solvent or an alkaline aqueous solution which can dissolve the resin composition not exposed to the light. The resin composition in the area not exposed to the light is dissolved while the resin composition in the exposed area has been made insoluble by the crosslinking by polycondensation. As the result, the resin layer can be worked to form patterns such as holes using the mask.

The cis-diene-substituted polyamic acids having the structural units represented by formulae [1] to [5] can be converted into polyimides by the ring closure reaction with dehydration by heat curing the polyamic acids after the development. The condition of the heat curing reaction is not particularly limited. In general, it is preferable that the reaction is conducted by heating at 150 to 250° C. for 30 minutes or more. The heating can be conducted by using heated air, irradiation of infrared light or heated plates. The heating can be ordinarily conducted in the atmosphere of the air. Where necessary, the heating may be conducted in the atmosphere of an inert gas such as nitrogen and carbon dioxide or at a reduced pressure. It is not always necessary that the cis-diene-substituted polyimide is treated by the heat curing reaction. However, the heating at the above temperature condition gives the resin the history at high temperature and heat resistance of the resin can be improved. By using the resin composition of the present invention in the above working steps, the patterned resin layer having excellent heat resistance can be formed by working at low temperatures and printed circuit wiring boards, substrates for disposing semiconductor chips and semiconductor devices having excellent properties can be produced.

To summarize the advantages of the invention, the photosensitive resin composition of the present invention has excellent properties as a heat resistant photoresist of the negative type. The polyamic acid and the polyimide used in the composition of the present invention are soluble in solvents such as an alkaline aqueous solution in the original form. When the polyamic acid and the polyimide are crosslinked by polycondensation with oxidation of the cis-diene group at the side chain with the singlet oxygen generated by the effect of the oxygen sensitizer such as fullerene C60, the polyamic acid and the polyimide become insoluble in solvents. Therefore, practically useful patterns of the negative type can be obtained with high sensitivity and high resolution which cannot be achieved by conventional heat resist compositions. In particular, heat resistance of the resin film after formation of the patterns can be remarkably improved by using a fullerene as the oxygen sensitizer. The polyamic acid and the polyimide in which the main chain is bonded to the meta-positions of an aromatic ring substituted with a monovalent organic group having a cis-diene structure provides a resin having more excellent heat resistance than that provided by the polyamic acid and the polyimide in which the main chain is bonded to the para-positions of an aromatic ring substituted with a monovalent organic group having a cis-diene structure. The printed wiring board, the substrate for disposing semiconductor chips and the semiconductor device of the present invention which are produced by using the composition of the present invention have excellent properties.

EXAMPLES

The present invention will be described more specifically with reference to examples in the following. However, the present invention is not limited to the examples.

Example 1

2-Hydroxy-3-methyl-1,4-phenylenediamine in an amount of 5.41 g (0.0392 mol) and 8.55 g (0.0392 mol) of pyromellitic dianhydride were reacted in 50 ml of N-methyl-2-pyrrolidone at the room temperature and a solution of a polyamic acid having the structural unit expressed by formula [17] was obtained.

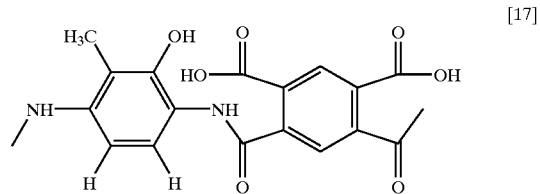

[17]

Separately, 5.00 g (0.0510 mol) of furfuryl alcohol was dissolved in 50 ml of tetrahydrofuran and 4.90 g (0.0181 mol) of phosphorus tribromide was added dropwise to the prepared solution. After the reaction mixture was stirred for about 1.5 hours, water was added to the reaction mixture and the organic component was extracted twice with 100 ml of ether. The ether layer was washed with sodium hydrogencarbonate and sodium chloride, dried with 30 g of molecular sieves overnight and filtered to obtain an ether solution of furfuryl bromide. The product was confirmed to be furfuryl bromide by the analyses of the obtained solution in accordance with $^1$H-NMR and $^{13}$C-NMR.

Then, the solution of the polyamic acid prepared above was diluted by adding 150 ml of N-methyl-2-pyrrolidone so that the homogeneous reaction can be conducted. To the diluted solution, the above ether solution in an amount such that 7.70 g (0.0510 mol) of furfuryl bromide was contained and 6.50 g (0.0470 mol) of potassium carbonate were added and the resultant mixture was stirred at 80° C. for about 2 hours. The reaction solution was added to methanol to form reprecipitates and the obtained precipitates were dried in vacuo to obtain 16.3 g of a polyamic acid having the structural unit expressed by formula [18]. The result of the analysis of the product in accordance with $^1$H-NMR showed that furfuryl group was introduced to 85% by mol of the hydroxyl groups of the diamine monomer units in the polyamic acid. The polyamic acid had a molecular weight of 80,000.

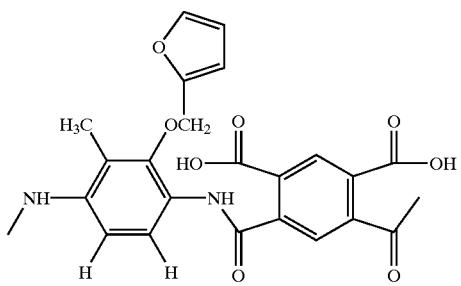

[18]

The obtained polyamic acid having the structural unit expressed by formula [18] in an amount of 15.0 g was dissolved into 100 ml of N-methyl-2-pyrrolidone and 0.072 g (0.0001 mol) of fullerene C60 [99.98% by weight; manufactured by TERM Company] as the oxygen sensitizer was added to the obtained solution.

The prepared solution was applied to a silicon wafer by spin coater and dried by heating at 80° C. for 10 minutes to form a coating film having a dried thickness of 1.5 μm. The film was placed at a position of 30 cm from a 250 W ultra-high pressure mercury lamp. The film was exposed to the light for 3 minutes through the negative type quartz photomask [a test chart of TOPPAN PRINTING Co., Ltd.]. After the exposure to the light, the film was developed with a 1.0% by weight aqueous solution of tetramethylammonium hydroxide until the surface of the silicon wafer appeared in the unexposed area. After rinsing with water, an excellent resin pattern of the negative type could be obtained.

A resin layer was formed by heating the obtained resin pattern at 200° C. for 1 hour. The decrease in the weight of the obtained resin layer after heating from the room temperature to 300° C. was measured using a TG/DTA apparatus [manufactured by SEIKO DENSHI KOGYO Co., Ltd.; TG/DTA 220 type; the rate of raising the temperature: 10° C./minute] and was found to be 0.5% by weight.

Example 2

2,2'-Dihydroxy-3,3'-dimethyl-4,4'-diaminobiphenyl in an amount of 9.56 g (0.0392 mol) and 8.55 g (0.0392 mol) of pyromellitic dianhydride were reacted in 50 ml of N-methyl-2-pyrrolidone at the room temperature and a solution of a polyamic acid having the structural unit expressed by formula [19] was obtained.

[19]

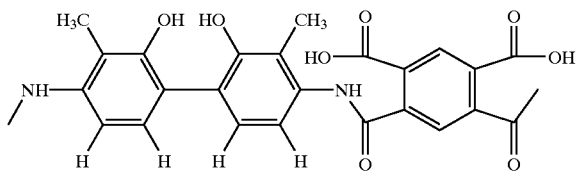

The above solution of the polyamic acid was diluted by addition of 150 ml of N-methyl-2-pyrrolidone so that the uniform reaction can be conducted. To the diluted solution, an ether solution of furfuryl bromide which was prepared in accordance with the same procedures as those conducted in Example 1 in an amount such that 7.70 g (0.0510 mol) of furfuryl bromide was contained and 6.50 g (0.0470 mol) of potassium carbonate were added and the resultant mixture was stirred at 80° C. for about 2 hours. The reaction solution was added to methanol to form reprecipitates and the obtained precipitates were dried in vacuo to obtain 19.5 g of a polyamic acid having the structural unit expressed by formula [20]. The result of the analysis of the product in accordance with $^1$H-NMR showed that furfuryl group was introduced to 86% by mol of the hydroxyl groups of the diamine monomer units in the polyamic acid.

[20]

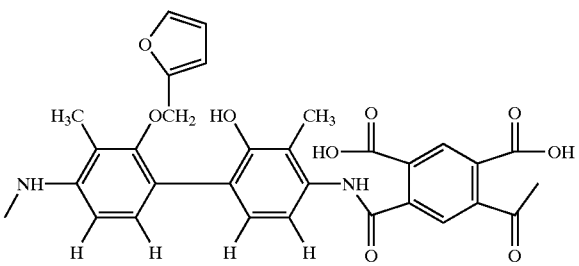

The obtained polyamic acid having the structural unit expressed by formula [20] in an amount of 15.0 g was dissolved into 100 ml of N-methyl-2-pyrrolidone and 0.072 g (0.0001 mol) of fullerene C60 [99.98% by weight; manufactured by TERM Company] as the oxygen sensitizer was added to the obtained solution.

The prepared solution was applied to a silicon wafer by spin coater and dried by heating at 80° C. for 10 minutes to form a coating film having a dried thickness of 1.5 μm. The film was placed at a position of 30 cm from a 250 W ultra-high pressure mercury lamp. The film was exposed to the light for 3 minutes through the negative type quartz photomask [a test chart of TOPPAN PRINTING Co., Ltd.]. After the exposure to the light, the film was developed with a 1.0% by weight aqueous solution of tetramethylammonium hydroxide until the surface of the silicon wafer appeared in the unexposed area. After rinsing with water, an excellent resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 0.8% by weight.

Example 3

In accordance with the same procedures as those conducted in Examples 1 except that an ether solution containing 8.52 g (0.0510 mol) of 2-thienylmethyl bromide was used in place of the ether solution of furfuryl bromide, 20.1 g of a polyamic acid having the structural unit expressed by formula [21] was obtained. The result of the analysis of the product in accordance with $^1$H-NMR showed that 2-thienylmethyl group was introduced to 88% by mol of the hydroxyl groups of the diamine monomer units in the polyamic acid.

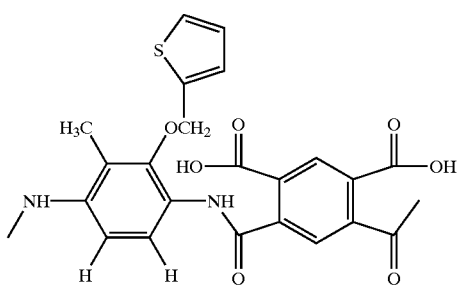

[21]

The obtained polyamic acid having the structural unit expressed by formula [21] in an amount of 15.0 g was dissolved into 100 ml of N-methyl-2-pyrrolidone and 0.072 g (0.0001 mol) of fullerene C60 [99.98% by weight; manufactured by TERM Company] as the oxygen sensitizer was added to the obtained solution.

The prepared solution was applied to a silicon wafer by spin coater and dried by heating at 80° C. for 10 minutes to form a coating film having a dried thickness of 1.5 μm. The film was placed at a position of 30 cm from a 250 W ultra-high pressure mercury lamp. The film was exposed to the light for 3 minutes through the negative type quartz photomask [a test chart of TOPPAN PRINTING Co., Ltd.]. After the exposure to the light, the film was developed with a 1.0% by weight aqueous solution of tetramethylammonium hydroxide until the surface of the silicon wafer appeared in the unexposed area. After rinsing with water, an excellent resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 0.7% by weight.

Example 4

A solution was prepared and applied to a silicon wafer by spin coater and dried by heating to form a coating film and the formed coating film was tightly attached with a mask and exposed to light using an ultra-high pressure mercury lamp in accordance with the same procedures as those conducted in Example 1 except that 0.102 g (0.0001 mol) of rose bengal was added as the oxygen sensitizer in place of 0.072 g (0.0001 mol) of fullerene C60 [99.98% by weight; manufactured by TERM Company].

After the exposure to the light, the film was developed with a 1.0% by weight aqueous solution of tetramethylammonium hydroxide until the surface of the silicon wafer appeared in the unexposed area. After rinsing with water, a resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 3.6% by weight.

Example 5

2,2-bis(3-Furfuryloxy-4-aminophenyl)propane in an amount of 16.39 g (0.0392 mol) and 8.55 g (0.0392 mol) of pyromellitic dianhydride were reacted in 200 ml of N-methyl-2-pyrrolidone at the room temperature and a solution of a polyamic acid was obtained. The obtained solution was treated by reprecipitation with methanol and the obtained precipitates were dried in vacuo to obtain 24.5 g of a polyamic acid having the structural unit expressed by formula [22].

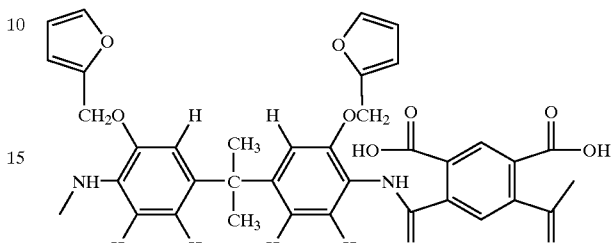

[22]

The obtained polyamic acid having the structural unit expressed by formula [22] in an amount of 15.0 g was dissolved into 100 ml of N-methyl-2-pyrrolidone and 0.072 g (0.0001 mol) of fullerene C60 [99.98% by weight; manufactured by TERM Company] as the oxygen sensitizer was added to the obtained solution.

The prepared solution was applied to a silicon wafer by spin coater and dried by heating at 80° C. for 10 minutes to form a coating film having a dried thickness of 1.5 μm. The film was placed at a position of 30 cm from a 250 W ultra-high pressure mercury lamp. The film was exposed to the light for 3 minutes through the negative type quartz photomask [a test chart of TOPPAN PRINTING Co., Ltd.]. After the exposure to the light, the film was developed with a 1.0% by weight aqueous solution of tetramethylammonium hydroxide until the surface of the silicon wafer appeared in the unexposed area. After rinsing with water, an excellent resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 1.2% by weight.

Example 6

3,3'-Difurfuryloxy-4,4'-diaminobiphenyl in an amount of 14.74 g (0.0392 mol) and 17.41 g (0.0392 mol) of 4,4'-hexafluoroisopropylidene-diphthalic anhydride were reacted in 200 ml of N-methyl-2-pyrrolidone at the room temperature and a solution of a polyamic acid was obtained. The obtained solution was treated by reprecipitation with methanol and the obtained precipitates were dried in vacuo to obtain 31.6 g of a polyamic acid having the structural unit expressed by formula [23].

[23]

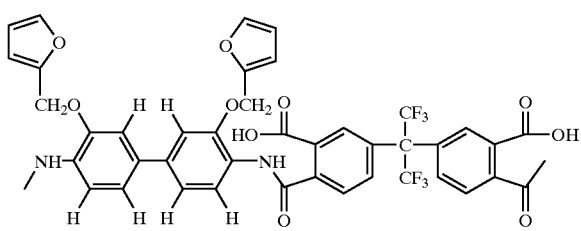

The obtained polyamic acid having the structural unit expressed by formula [23] in an amount of 15.0 g was dissolved into 100 ml of N-methyl-2-pyrrolidone and 0.072 g (0.0001 mol) of fullerene C60 [99.98% by weight; manufactured by TERM Company] as the oxygen sensitizer was added to the obtained solution.

The prepared solution was applied to a silicon wafer by spin coater and dried by heating at 80° C. for 10 minutes to form a coating film having a dried thickness of 1.5 μm. The film was placed at a position of 30 cm from a 250 W ultra-high pressure mercury lamp. The film was exposed to the light for 3 minutes through the negative type quartz photomask [a test chart of TOPPAN PRINTING Co., Ltd.]. After the exposure to the light, the film was developed with a 1.0% by weight aqueous solution of tetramethylammonium hydroxide until the surface of the silicon wafer appeared in the unexposed area. After rinsing with water, a remarkably excellent resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 0.8% by weight.

Using the solution obtained above, a coating film was formed, preliminarily heated and exposed to a prescribed amount of light. Then, the coating film was developed for 2 minutes with a 1.0% by weight aqueous solution of tetramethylammonium hydroxide. By repeating this procedure using different amounts of the light, a characteristic curve showing the sensitivity was prepared and the minimum amount of light to make the film insoluble was obtained. The minimum amount of light was $2 \times 10$ mJ·cm$^{-2}$.

Example 7

A solution was prepared and applied to a silicon wafer by spin coater and dried by heating to form a coating film and the formed coating film was tightly attached with a mask and exposed to light using an ultra-high pressure mercury lamp in accordance with the same procedures as those conducted in Examples 6 except that 0.053 g (0.0001 mol) of rubrene was added as the oxygen sensitizer in place of 0.072 g (0.0001 mol) of fullerene C60 [99.98% by weight; manufactured by TERM Company].

After the exposure to the light, the film was developed with a 1.0% by weight aqueous solution of tetramethylammonium hydroxide until the surface of the silicon wafer appeared in the unexposed area. After rinsing with water, a resin pattern of the negative type could be obtained.

A resin layer was formed by heating the obtained resin pattern at 200° C. for 1 hour. The decrease in the weight of the obtained resin layer after heating from the room temperature to 300° C. was measured in accordance with the same method as that used in Example 1 and was found to be 1.8% by weight.

In accordance with the same procedure as that conducted in Example 6, a characteristic curve showing the sensitivity was prepared and the minimum amount of light to make the film insoluble was obtained. The minimum amount of light was $8 \times 10$ mJ·cm$^{-2}$.

Example 8

3,3-Diamino-4,4'-dihydroxybiphenyl in an amount of 8.47 g (0.0392 mol) and 8.55 g (0.0392 mol) of pyromellitic dianhydride were stirred in 50 ml of N-methyl-2-pyrrolidone at 60° C. and a solution of a polyamic acid was obtained.

Separately, 5.00 g (0.0510 mol) of furfuryl alcohol was dissolved in 50 ml of tetrahydrofuran and 4.90 g (0.0181 mol) of phosphorus tribromide was added dropwise to the prepared solution while the solution was kept at 0° C. After the solution was stirred for about 2 hours, water was added to the solution and the organic component was extracted twice with 100 ml of ether. The ether layer was washed with sodium hydrogencarbonate, dried with 30 g of molecular sieves overnight and filtered to obtain an ether solution of furfuryl bromide. The product was confirmed to be furfuryl bromide by the analyses of the obtained solution in accordance with FT-IR, $^1$H-NMR and $^{13}$C-NMR.

Then, the above solution of the polyamic acid was diluted by adding 150 ml of N-methyl-2-pyrrolidone. To the diluted solution, the above ether solution in an amount such that 7.70 g (0.0510 mol) of furfuryl bromide was contained and 6.50 g of potassium carbonate were added and the resultant solution was stirred at 80° C. for about 2 hours. The reaction solution was added to methanol to coagulate reprecipitates and the obtained precipitates were dried in vacuo to obtain 16.3 g of a polyamic acid having the structural unit represented by formula [24]. In formula [24], Z represents hydrogen or furfuryl group. The result of the analysis of the product in accordance with $^1$H-NMR showed that furfuryl group was introduced to 80% by mol of the hydroxyl groups of the diamine monomer units in the polyamic acid. The polyamic acid had a molecular weight of 70,000.

[24]

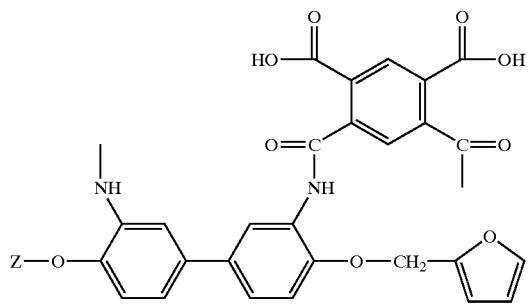

High purity fullerene C60 [99.98% by weight; manufactured by TERM Company] in an amount of 0.75 g and 10.0 g of the above polyamic acid partially substituted with furfuryl group were dissolved in 50 ml of γ-butyrolactone/1,1,2,2-tetrachloroethylene (the ratio by volume: 70/30) to prepare a homogeneous solution. After the prepared solution was filtered through a filter having a pore size of 0.1 μm, the solution was applied to a silicon wafer by spin coater and dried by heating at 80° C. for 10 minutes to form a coating film having a thickness of 2 μm. The coating film was exposed by a 500 W ultra-high pressure mercury lamp through a photomask [a test chart of TOPPAN PRINTING Co., Ltd.] and, immediately thereafter, dipped into a 10% by weight aqueous solution of tetramethylammonium hydroxide for 30 seconds for the development. The unexposed area was dissolved and completely removed and a resin pattern having a line width of 5 µm or less was formed.

The obtained resin pattern was heated at 200° C. for 1 hour to form a resin layer. The decrease in the weight of this resin layer after heating from the room temperature to 300° C. was measured in accordance with the same procedure as that conducted in Example 1 and was found to be 0.3% by weight.

Example 9

2,2-bis(3-Amino-4-hydroxyphenyl)hexafluoropropane in an amount of 14.36 g (0.0392 mol) and 8.55 g (0.0392 mol) of pyromellitic dianhydride were stirred in 50 ml of N-methyl-2-pyrrolidone at 60° C. and a solution of a polyamic acid was obtained.

Then, the above solution of the polyamic acid was diluted by adding 150 ml of N-methyl-2-pyrrolidone. To the diluted solution, an ether solution containing 7.70 g of furfuryl bromide and 6.50 g of potassium carbonate were added and the resultant solution was stirred at 80° C. for about 2 hours. The reaction solution was added to methanol to coagulate reprecipitates and the obtained precipitates were dried in vacuo to obtain 20.3 g of a polyamic acid having the structural unit represented by formula [25]. In formula [25], Z represents hydrogen or furfuryl group. The result of the analysis of the product in accordance with $^1$H-NMR showed that furfuryl group was introduced to 80% by mol of the hydroxyl groups of the diamine monomer units in the polyamic acid. The polyamic acid had a molecular weight of about 50,000.

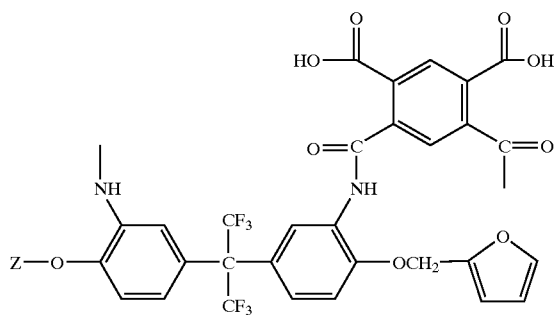

[25]

High purity fullerene C60 [99.98% by weight; manufactured by TERM Company] in an amount of 0.75 g and 10.0 g of the above polyamic acid partially substituted with furfuryl group were dissolved in 50 ml of g-butyrolactone/ 1,1,2,2-tetrachloroethylene (the ratio by volume: 70/30) to prepare a homogeneous solution. After the prepared solution was filtered through a filter having a pore size of 0.1 µm, the solution was applied to a silicon wafer by spin coater and dried by heating at 80° C. for 10 minutes to form a coating film having a thickness of 2 µm. The coating film was exposed to the light of a 500 W ultra-high pressure mercury lamp through a photomask [a test chart of TOPPAN PRINTING Co., Ltd.] and, immediately thereafter, dipped into a 10% by weight aqueous solution of tetramethylammonium hydroxide for 30 seconds for the development. The unexposed area was dissolved and completely removed and a resin pattern having a line width of 5 µm or less was formed.

The obtained resin pattern was heated at 200° C. for 1 hour to form a resin layer. The decrease in the weight of this resin layer after heating from the room temperature to 300° C. was measured using the TG/DTA apparatus in accordance with the same procedure as that conducted in Example 1 and was found to be 0.5% by weight.

Reference Example 1

Preparation of 3,5-diaminobenzyl-2-furoate

Preparation of 3,5-dinitrobenzyl-2-furoate: In a 500 ml separable flask equipped with a stirrer, a reflux condenser cooled with water, a thermometer and a dropping funnel, 37.0 g of 3,5-dinitrobenzyl alcohol was dissolved into 100 ml of pyridine. While the prepared solution was cooled at 0 to 5° C., 53.1 g of 2-furoyl chloride was added dropwise to the solution. After the addition was completed, the reaction solution was warmed to the room temperature and stirred for 2 hours. Then, 400 ml of water was added to the solution and the solid substance was separated by filtration. The obtained solid substance was recrystallized from ethyl alcohol/water (the volume ratio: 80/20) to obtain 47 g of 3,5-dinitrobenzyl-2-furoate. The yield was 86% and the melting point was 116 to 117° C.

Preparation of 3,5-diaminobenzyl-2-furoate: In a 1 liter separable flask equipped with a stirrer and a reflux condenser cooled with water, 14.6 g of 3,5-dinitrobenzyl-2-furoate was dissolved into 120 ml of ethyl acetate and 80 ml of ethyl alcohol. To the prepared solution, 120 ml of a saturated aqueous solution of ammonium chloride was added and then 100 g of powder of indium metal was added. The obtained mixture was stirred under the refluxing condition for 17 hours to allow the reduction to proceed. After the reaction was completed, the reaction solution was transferred to a 2 liter beaker. One liter of water was added to the reaction solution and the solid substance was removed by filtration. After pH of the filtrate was adjusted to 9 by adding a 2N aqueous solution of sodium hydroxide, the filtrate was extracted with ethyl acetate and the ethyl acetate layer was dried with magnesium sulfate. Then, ethyl acetate was removed by distillation at a reduced pressure and 10 g of a crude product was obtained. The crude product was purified in accordance with the silica gel column chromatography to obtain 4.6 g of 3,5-diaminobenzyl-2-furoate. The yield was 40%. This product was recrystallized from ethyl alcohol and needle crystals having a melting point of 119 to 121.1° C. were obtained.

The synthesis and the purification were conducted twice more in accordance with the same procedures.

Example 10

3,5-Diaminobenzyl-2-furoate synthesized in Reference Example 1 in an amount of 9.09 g (0.0392 mol) and 17.41 g (0.0392 mol) of 4,4'-hexafluoroisopropylidenediphthalic anhydride were stirred in 50 ml of γ-butyrolactone at the room temperature and a solution of a polyamic acid having the structural unit expressed by formula [26] was obtained. The obtained solution was diluted by adding 50 ml of N-methyl-2-pyrrolidone. The diluted solution was poured into water/methanol (the volume ratio: 75/25) to coagulate and precipitate polyamic acid. After filtration and drying in vacuo, 25.9 g of a polyamic acid having the structural unit expressed by formula [26] was obtained as light yellow powder.

[26]

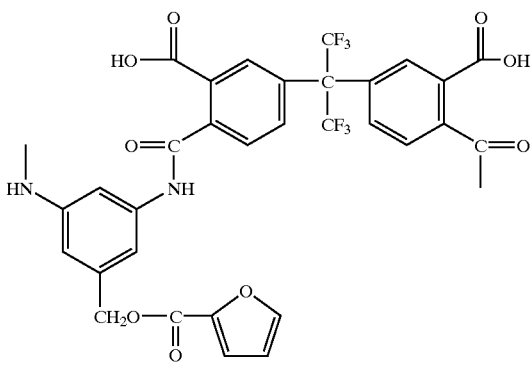

High purity fullerene C60 [99.98% by weight; manufactured by TERM Company] in an amount of 0.75 g and 10.0 g of the above polyamic acid substituted with furoyl group were dissolved in 50 ml of γ-butyrolactone/1,1,2,2-tetrachloroethylene (the ratio by volume: 70/30) to prepare a homogeneous solution. After the prepared solution was filtered through a filter having a pore size of 0.1 μm, the solution was applied to a silicon wafer by spin coater and dried by heating at 80° C. for 10 minutes to form a coating film having a thickness of 2 μm. The coating film was exposed to the light of a 500 W ultra-high pressure mercury lamp through a photomask [a test chart of TOPPAN PRINTING Co., Ltd.] and, immediately thereafter, dipped into a 10% by weight aqueous solution of tetramethylammonium hydroxide for 30 seconds for the development. The unexposed area was dissolved and completely removed and a resin pattern having a line width of 5 μm or less was formed.

The obtained resin pattern was heated at 200° C. for 1 hour to form a resin layer. The decrease in the weight of this resin layer after heating from the room temperature to 300° C. was measured in accordance with the same procedure as that conducted in Example 1 and was found to be 0.3% by weight.

Reference Example 2
Synthesis of 3,3'-diamino-4,4'-di-2-furoylamino-biphenyl)

Preparation of 3,3'-dinitro-4,4'-di-2-furoylaminobiphenyl: In a 500 ml separable flask equipped with a stirrer, a reflux condenser cooled with water, a thermometer and a dropping funnel, 10.96 g of 3,3'-dinitro-4,4'-diaminobiphenyl was dissolved into 200 ml of N,N-dimethylformamide and then 20 ml of pyridine was added to the solution. While the prepared solution was cooled at 3 to 14° C., 12.53 g of 2-furoyl chloride was added dropwise to the solution. After the addition was completed, the reaction solution was warmed to the room temperature and stirred for further 5 hours. Then, 80 ml of 2N hydrochloric acid and 100 ml of water were added to the solution and the solid substance was separated by filtration. The obtained solid substance was washed well with water and dried in a reduced pressure to obtain 15.0 g of 3,3'-dinitro-4,4'-di-2-furoylamino-biphenyl. The yield was 81%.

Preparation of 3,3'-diamino-4,4'-di-2-furoylaminobiphenyl: Into a separable flask equipped with a stirrer and a reflux condenser cooled with water, 7.4 g of 3,3'-dinitro-4,4'-di-2-furoylaminobiphenyl, 100 ml of N-methyl-2-pyrrolidone and 75 ml of ethyl alcohol were placed. After adding 40 ml of a saturated aqueous solution of ammonium chloride, 25.6 g of powder of indium metal was added to the prepared solution. The obtained mixture was stirred at 80° C. for 1 hour. After the reaction solution was cooled to the room temperature, the solid substance was removed by filtration. The filtrate was concentrated to about one half at a reduced pressure. To the concentrated filtrate, 300 ml of water was added and the formed solid substance was separated by filtration to obtain 2.9 g of a crude product. The crude product was purified in accordance with the silica gel column chromatography to obtain 1.5 g of 3,3'-diamino-4,4'-di-2-furoylaminobiphenyl. The yield of the isolated product was 23%. This product was recrystallized from N-methyl-2-pyrrolidone/ethyl acetate (the volume ratio: 25/75) and needle crystals having a decomposition temperature of 256 to 259° C. were obtained.

The synthesis and the purification were conducted 12 times more in accordance with the same procedures.

Example 11

3,3'-Diamino-4,4'-di-2-furoylaminobiphenyl synthesized in Reference Example 2 in an amount of 15.76 g (0.0392 mol) and 17.41 g (0.0392 mol) of 4,4'-hexafluoroisopropylidenediphthalic anhydride were stirred in 50 ml of γ-butyrolactone at the room temperature and a solution of a polyamic acid having the structural unit expressed by formula [27] was obtained. The obtained solution was diluted by adding 50 ml of N-methyl-2-pyrrolidone. The diluted solution was poured into water/methanol (the volume ratio: 75/25) to coagulate and precipitate the polyamic acid. After filtration and drying in vacuo, 31.5 g of a polyamic acid having the structural unit expressed by formula [27] was obtained as light yellow powder.

[27]

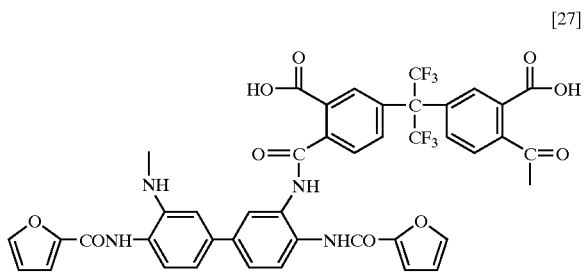

High purity fullerene C60 [99.98% by weight; manufactured by TERM Company] in an amount of 0.75 g and 10.0 g of the above polyamic acid substituted with furoyl group were dissolved in 50 ml of γ-butyrolactone/toluene (the ratio by volume: 60/40) to prepare a homogeneous solution.

After the prepared solution was filtered through a filter having a pore size of 0.1 μm, the solution was applied to a silicon wafer by spin coater and dried by heating at 80° C. for 10 minutes to form a coating film having a thickness of 2 μm. The coating film was exposed to the light of a 500 W ultra-high pressure mercury lamp through a photomask [a test chart of TOPPAN PRINTING Co., Ltd.] and, immediately thereafter, dipped into a 10% by weight aqueous solution of tetramethylammonium hydroxide for 30 seconds for the development. The unexposed area was dissolved and completely removed and a resin pattern having a line width of 5 μm or less was formed.

The obtained resin pattern was heated at 200° C. for 1 hour to form a resin layer. The decrease in the weight of this resin layer after heating from the room temperature to 300° C. was measured in accordance with the same procedure as that conducted in Example 1 and was found to be 0.2% by weight.

Comparative Example 1

A polyamic acid partially having furfuryl group was synthesized in accordance with the same procedures as those conducted in Example 1 except that furfuryl bromide which was reacted with the polyamic acid having the structural unit expressed by formula [17] was used in an amount of 1.78 g (0.0118 mol). The results of the $^1$H-NMR analysis showed that furfuryl group was introduced to 8% by mol of the hydroxyl groups of the diamine monomer units in the polyamic acid.

The obtained polyamic acid partially substituted with furfuryl group in an amount of 12.0 g was dissolved into 80 ml of N-methyl-2-pyrrolidone. To this solution, 0.0576 g (0.00008 mol) of fullerene C60 [99.98% by weight; manufactured by TERM Company] as the oxygen sensitizer was added.

The prepared solution was applied to a silicon wafer by spin coater and dried by heating to form a coating film and the formed coating film was tightly attached with a mask and exposed to light using an ultra-high pressure mercury lamp in accordance with the same procedures as those conducted in Example 1. After the exposure to the light, the film was developed with a 1.0% by weight aqueous solution of tetramethylammonium hydroxide. All portions of the coating film including the exposed portions were dissolved into the developer and no resin pattern could be obtained.

The results of Examples 1 to 11 and Comparative Example 1 are shown in Table 1.

resin compositions of Examples 8 to 11 in which the main chain is bonded to the meta-positions of the aromatic ring showed smaller decreases in the weight after heating and exhibited more excellent heat resistance than those of the resin layers obtained from the photosensitive resin compositions of Examples 1 to 3 and 5 to 6 in which the main chain is bonded to the para-positions of the aromatic ring Regarding to the photosensitive resin compositions containing the cis-diene-substituted polyamic acid having structural unit represented by formula 23, the photosensitive resin composition of Example 6 in which a fullerene was used as the oxygen sensitizer showed better sensitivity than that of the photosensitive resin composition of Example 7 in which rubrene was used as the oxygen sensitizer.

On the other hand, the photosensitive resin composition of Comparative Example 1 containing the structural unit substituted with a cis-diene which is represented by general formula [1] in an amount of 8% of the total diamine structural units was dissolved into the developer even after the exposure to the light and resin patterns could not be formed.

What is claimed is:

1. A printed wiring board or a substrate for disposing semiconductor chips which is prepared by coating a printed wiring substrate with a photosensitive resin composition and forming fine patterns by exposure of the composition to radiation, wherein the photosensitive resin composition comprises an oxygen sensitizer and a cis-diene-substituted polyamic acid or polyimide having a structural unit of a formula selected from the group consisting of a formula (1), a formula (2), a formula (3), a formula (4) and a formula (5), wherein the formula (1) is as follows:

TABLE 1

| | Structure of polyamic acid | cis-Diene structure | Fraction substituted with cis-diene (% by mol) | Oxygen sensitizer | Decrease in weight after heating (% by wt.) | Minimum amount of light to make insoluble (mJ · cm$^{-2}$) |
|---|---|---|---|---|---|---|
| Example 1 | Formula [18] | furan | 85 | fullerene | 0.5 | — |
| Example 2 | Formula [20] | furan | 86 | fullerene | 0.8 | — |
| Example 3 | Formula [21] | thiophene | 88 | fullerene | 0.7 | — |
| Example 4 | Formula [18] | furan | 85 | rose bengal | 3.6 | — |
| Example 5 | Formula [22] | furan | 100 | fullerene | 1.2 | — |
| Example 6 | Formula [23] | furan | 100 | fullerene | 0.8 | 2 × 10 |
| Example 7 | Formula [23] | furan | 100 | rubrene | 1.8 | 8 × 10 |
| Example 8 | Formula [24] | furan | 80 | fullerene | 0.3 | — |
| Example 9 | Formula [25] | furan | 80 | fullerene | 0.5 | — |
| Example 10 | Formula [26] | furan | 100 | fullerene | 0.3 | — |
| Example 11 | Formula [27] | furan | 100 | fullerene | 0.2 | — |
| Comparative Example 1 | Formula [11] | furan8 | 8 | fullerene | —$^{1)}$ | — |

$^{1)}$Dissolved into the developing solution even after exposure to the light

As shown in Table 1, the resin layers showing small decreases in the weight after heating and exhibiting excellent heat resistance could be obtained from the photosensitive resin compositions of Examples 1 to 11 which contained cis-diene-substituted polyamic acids having the structural units represented by general formulae [1] to [5] and the oxygen sensitizer. In particular, the resin layers obtained from the resin compositions of Examples 1 to 3, 5 to 6 and 9 to 11 in which a fullerene was used as the oxygen sensitizer showed smaller decreases in the weight after heating and exhibited more excellent heat resistance than those of the resin layers of Example 4 in which rose bengal was used as the oxygen sensitizer and the resin layers of Example 7 in which rubrene was used as the oxygen sensitizer. Among the resin layers obtained from the photosensitive resin compositions using a fullerene as the oxygen sensitizer, the resin layers obtained from the photosensitive

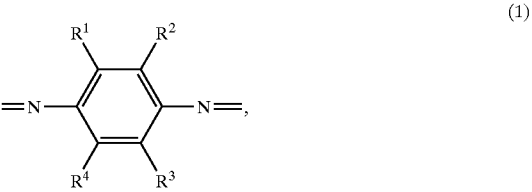

(1)

wherein at least one of $R^1$, $R^2$, $R^3$ and $R^4$ represents a monovalent organic group having a cis-diene structure; and the rest of $R^1$, $R^2$, $R^3$ and $R^4$ each independently represents a hydrogen atom, a hydroxyl group, a carboxyl group, an alkyl group having 1 to 20 carbon atoms or an alkoxy group having 1 to 20 carbon atoms;

wherein the formula (2) is as follows:

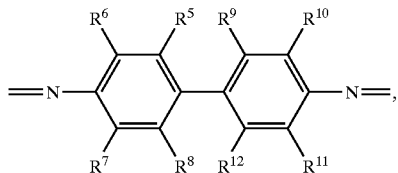

wherein at least one of $R^5$, $R^6$, $R^7$, $R^8$, $R^9$, $R^{10}$, $R^{11}$ and $R^{12}$ represents a monovalent organic group having a cis-diene-structure; and the rest of $R^5$, $R^6$, $R^7$, $R^8$, $R^9$, $R^{10}$, $R^{11}$ and $R^{12}$ each independently represents a hydrogen atom, a hydroxyl group, a carboxyl group, an alkyl group having 1 to 20 carbon atoms or an alkoxy group having 1 to 20 carbon atoms;

wherein the formula (3) is as follows:

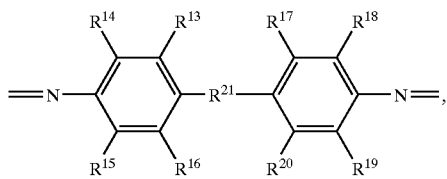

wherein at least one of $R^{13}$, $R^{14}$, $R^{15}$, $R^{16}$, $R^{17}$, $R^{18}$, $R^{19}$ and $R^{20}$ represents a monovalent organic group having a cis-diene-structure; and the rest of R13, $R^{14}$, $R^{15}$, $R^{16}$, $R^{17}$, $R^{18}$, $R^{19}$ and $R^{20}$ each independently represents a hydrogen atom, a hydroxyl group, a carboxyl group, an alkyl group having 1 to 20 carbon atoms or an alkoxy group having 1 to 20 carbon atoms; and $R^{21}$ represents oxygen, sulfur, an alkylene group having 1 to 4 carbon atoms, an alkylidene group having 1 to 4 carbon atoms or an alkyleneoxy group having 1 to 4 carbon atoms;

wherein the formula (4) is as follows:

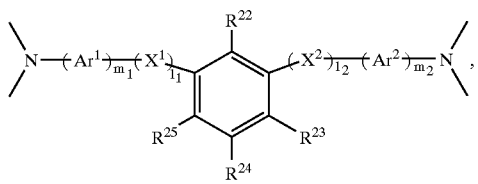

wherein at least one of $R^{22}$, $R^{23}$, $R^{24}$ and $R^{25}$ represents a monovalent organic group having a cis-diene-structure; the rest of $R^{22}$, $R^{23}$, $R^{24}$ and $R^{25}$ each independently represents a hydrogen atom, a hydroxyl group, a carboxyl group, an alkyl group having 1 to 20 carbon atoms or an alkoxy group having 1 to 20 carbon atoms; $X^1$ and $X^2$ each independently represents oxygen, sulfur, an alkylene group having 1 to 4 carbon atoms, an alkylidene group having 1 to 4 carbon atoms or an alkyleneoxy group having 1 to 4 carbon atoms; $Ar^1$ and $Ar^2$ each independently represents a divalent aromatic group; and $l_1$, $l_2$, $m_1$ and $m_2$ represents 1 when $l_2$ represents 1;

wherein the formula (5) is as follows:

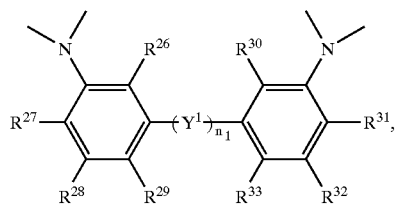

wherein at least one of $R^{26}$, $R^{27}$, $R^{28}$, $R^{29}$, $R^{30}$, $R^{31}$, $R^{32}$ and $R^{33}$ represents a monovalent organic group having a cis-diene-structure; the rest of $R^{26}$, $R^{27}$, $R^{28}$, $R^{29}$, $R^{30}$, $R^{31}$, $R^{32}$ and $R^{33}$ each independently represents a hydrogen atom, a hydroxyl group, a carboxyl group, an alkyl group having 1 to 20 carbon atoms or an alkoxy group having 1 to 20 carbon atoms; $Y^1$ represents oxygen, sulfur, an optionally substituted alkylene group having 1 to 4 carbon atoms, an optionally substituted alkylidene group having 1 to 4 carbon atoms or an optionally substituted alkyleneoxy group having 1 to 4 carbon atoms; and $n_1$ represents 0 or 1.

2. The printed wiring board or the substrate according to claim 1, wherein the cis-diene structure is a cyclopentadiene, furan, thiophene or pyrrole structure.

3. The printed wiring board or the substrate according to claim 2, wherein the oxygen sensitizer is a fullerene.

4. The printed wiring board or the substrate according to claim 1, wherein the oxygen sensitizer is a fullerene.

5. The printed wiring board or the substrate according to claim 1, wherein the cis-diene-substituted polyamic acid or polyimide has a structural unit of the formula (1).

6. The printed wiring board or the substrate according to claim 1, wherein the cis-diene-substituted polyamic acid or polyimide has a structural unit of the formula (2).

7. The printed wiring board or the substrate according to claim 1, wherein the cis-diene-substituted polyamic acid or polyimide has a structural unit of the formula (3).

8. The printed wiring board or the substrate according to claim 1, wherein the cis-diene-substituted polyamic acid or polyimide has a structural unit of the formula (4).

9. The printed wiring board or the substrate according to claim 1, wherein the cis-diene-substituted polyamic acid or polyimide has a structural unit of the formula (5).

10. The printed wiring board or the substrate according to claim 9, wherein $Y^1$ is

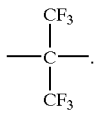

11. The printed wiring board or the substrate according to claim 1, which is a printed wiring board.

12. The printed wiring board or the substrate according to claim 1, which is a substrate for disposing semiconductor chips.

13. A semiconductor device which is prepared by coating a substrate on which semiconductor chips are disposed with a photosensitive resin composition and forming fine patterns by exposure of the composition to radiation, wherein the photosensitive resin composition comprises an oxygen sensitizer and a cis-diene-substituted polyamic acid or polyimide having a structural unit of a formula selected from the group consisting of a formula (1), a formula (2), a formula (3), a formula (4) and a formula (5), wherein the formula (1) is as follows:

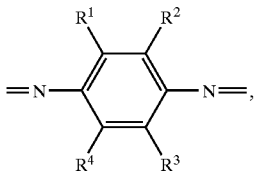

(1)

wherein at least one of $R^1$, $R^2$, $R^3$ and $R^4$ represents a monovalent organic group having a cis-diene structure; and the rest of $R^1$, $R^2$, $R^3$ and $R^4$ each independently represents a hydrogen atom, a hydroxyl group, a carboxyl group, an alkyl group having 1 to 20 carbon atoms or an alkoxy group having 1 to 20 carbon atoms;

wherein the formula (2) is as follows:

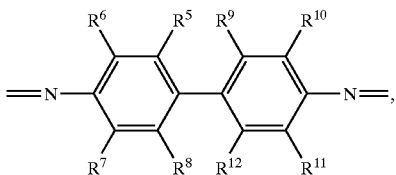

(2)

wherein at least one of $R^5$, $R^6$, $R^7$, $R^8$, $R^9$, $R^{10}$, $R^{11}$ and $R^{12}$ represents a monovalent organic group having a cis-diene-structure; and the rest of $R^5$, $R^6$, $R^7$, $R^8$, $R^9$, $R^{10}$, $R^{11}$ and $R^{12}$ each independently represents a hydrogen atom, a hydroxyl group, a carboxyl group, an alkyl group having 1 to 20 carbon atoms or an alkoxy group having 1 to 20 carbon atoms;

wherein the formula (3) is as follows:

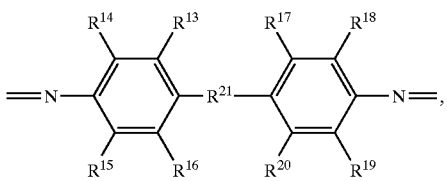

(3)

wherein at least one of $R^{13}$, $R^{14}$, $R^{15}$, $R^{16}$, $R^{17}$, $R^{18}$, $R^{19}$ and $R^{20}$ represents a monovalent organic group having a cis-diene-structure; and the rest of $R^{13}$, $R^{14}$, $R^{15}$, $R^{16}$, $R^{17}$, $R^{18}$, $R^{19}$ and $R^{20}$ each independently represents a hydrogen atom, a hydroxyl group, a carboxyl group, an alkyl group having 1 to 20 carbon atoms or an alkoxy group having 1 to 20 carbon atoms; and $R^{21}$ represents oxygen, sulfur, an alkylene group having 1 to 4 carbon atoms, an alkylidene group having 1 to 4 carbon atoms or an alkyleneoxy group having 1 to 4 carbon atoms;

wherein the formula (4) is as follows:

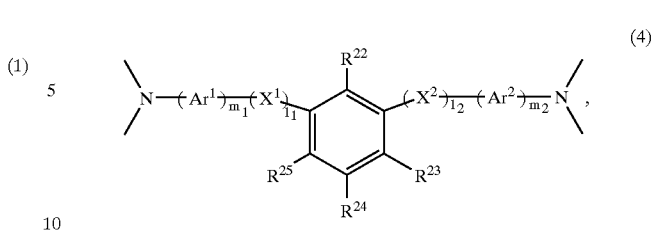

(4)

wherein at least one of $R^{22}$, $R^{23}$, $R^{24}$ and $R^{25}$ represents a monovalent organic group having a cis-diene-structure; the rest of $R^{22}$, $R^{23}$, $R^{24}$ and $R^{25}$ each independently represents a hydrogen atom, a hydroxyl group, a carboxyl group, an alkyl group having 1 to 20 carbon atoms or an alkoxy group having 1 to 20 carbon atoms; $X^1$ and $X^2$ each independently represents oxygen, sulfur, an alkylene group having 1 to 4 carbon atoms, an alkylidene group having 1 to 4 carbon atoms or an alkyleneoxy group having 1 to 4 carbon atoms; $Ar^1$ and $Ar^2$ each independently represents a divalent aromatic group; and $l_1$, $l_2$, $m_1$, and $m_2$ represents 1 when $l_2$ represents 1;

wherein the formula (5) is as follows:

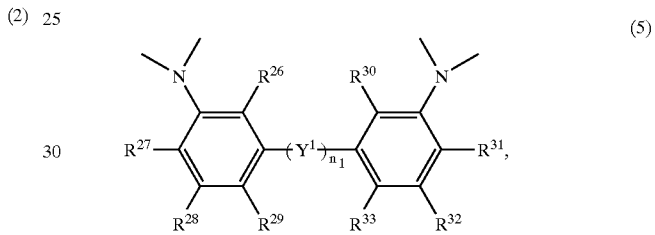

(5)

wherein at least one of $R^{26}$, $R^{27}$, $R^{28}$, $R^{29}$, $R^{30}$, $R^{31}$, $R^{32}$ and $R^{33}$ represents a monovalent organic group having a cis-diene-structure; the rest of $R^{26}$, $R^{27}$, $R^{28}$, $R^{29}$, $R^{30}$, $R^{31}$, $R^{32}$ and $R^{33}$ each independently represents a hydrogen atom, a hydroxyl group, a carboxyl group, an alkyl group having 1 to 20 carbon atoms or an alkoxy group having 1 to 20 carbon atoms; $Y^1$ represents oxygen, sulfur, an optionally substituted alkylene group having 1 to 4 carbon atoms, an optionally substituted alkylidene group having 1 to 4 carbon atoms or an optionally substituted alkyleneoxy group having 1 to 4 carbon atoms; and $n_1$ represents 0 or 1.

14. The semiconductor device according to claim 13, wherein the cis-diene structure is a structure of cyclopentadiene, furan, thiophene or pyrrole.

15. The semiconductor device according to claim 14, wherein the oxygen sensitizer is a fullerene.

16. The semiconductor device according to claim 13, wherein the oxygen sensitizer is a fullerene.

17. The semiconductor device according to claim 13, wherein the cis-diene-substituted polyamic acid or polyimide has a structural unit of the formula (1).

18. The semiconductor device according to claim 13, wherein the cis-diene-substituted polyamic acid or polyimide has a structural unit of the formula (2).

19. The semiconductor device according to claim 13, wherein the cis-diene-substituted polyamic acid or polyimide has a structural unit of the formula (3).

20. The semiconductor device according to claim 13, wherein the cis-diene-substituted polyamic acid or polyimide has a structural unit of the formula (4).

21. The semiconductor device according to claim 13, wherein the cis-diene-substituted polyamic acid or polyimide has a structural unit of the formula (5).

22. The semiconductor device according to claim 21, wherein $Y^1$ is

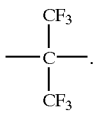

23. A process for producing a printed wiring board or a substrate for disposing semiconductor chips which comprises
(a) coating a printed wiringsubstrate with a photosensitive resin composition which comprises (i) an oxygen sensitizer and (ii) a cis-diene-substituted polyamic acid or polyimide having a structural unit of a formula selected from the group consisting of a formula (1), a formula (2), a formula (3), a formula (4) and a formula (5), wherein the formula (1) is as follows:

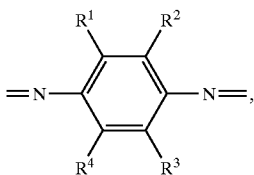

wherein at least one of $R^1$, $R^2$, $R^3$ and $R^4$ represents a monovalent organic group having a cis-diene structure; and the rest of $R^1$, $R^2$, $R^3$ and $R^4$ each independently represents a hydrogen atom, a hydroxyl group, a carboxyl group, an alkyl group having 1 to 20 carbon atoms or an alkoxy group having 1 to 20 carbon atoms;

wherein the formula (2) is as follows:

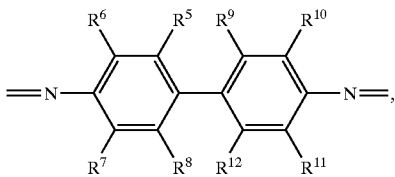

wherein at least one of $R^5$, $R^6$, $R^7$, $R^8$, $R^9$, $R^{10}$, $R^{11}$ and $R^{12}$ represents a monovalent organic group having a cis-diene-structure; and the rest of $R^5$, $R^6$, $R^7$, $R^8$, $R^9$, $R^{10}$, $R^{11}$ and $R^{12}$ each independently represents a hydrogen atom, a hydroxyl group, a carboxyl group, an alkyl group having 1 to 20 carbon atoms or an alkoxy group having 1 to 20 carbon atoms;

wherein the formula (3) is as follows:

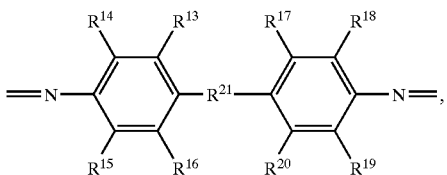

wherein at least one of $R^{13}$, $R^{14}$, $R^{15}$, $R^{16}$, $R^{17}$, $R^{18}$, $R^{19}$ and $R^{20}$ represents a monovalent organic group having a cis-diene-structure; and the rest of $R^{13}$, $R^{14}$, $R^{15}$, $R^{16}$, $R^{17}$, $R^{18}$, $R^{19}$ and $R^{20}$ each independently represents a hydrogen atom, a hydroxyl group, a carboxyl group, an alkyl group having 1 to 20 carbon atoms or an alkoxy group having 1 to 20 carbon atoms; and $R^{21}$ represents oxygen, sulfur, an alkylene group having 1 to 4 carbon atoms, an alkylidene group having 1 to 4 carbon atoms or an alkyleneoxy group having 1 to 4 carbon atoms;

wherein the formula (4) is as follows:

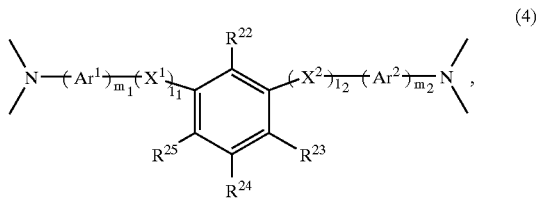

wherein at least one of $R^{22}$, $R^{23}$, $R^{24}$ and $R^{25}$ represents a monovalent organic group having a cis-diene-structure; the rest of $R^{22}$, $R^{23}$, $R^{24}$ and $R^{25}$ each independently represents a hydrogen atom, a hydroxyl group, a carboxyl group, an alkyl group having 1 to 20 carbon atoms or an alkoxy group having 1 to 20 carbon atoms; $X^1$ and $X^2$ each independently represents oxygen, sulfur, an alkylene group having 1 to 4 carbon atoms, an alkylidene group having 1 to 4 carbon atoms or an alkyleneoxy group having 1 to 4 carbon atoms; $Ar^1$ and $Ar^2$ each independently represents a divalent aromatic group; and $l_1$, $l_2$, $m_1$ and $m_2$ represents 1 when $l_2$ represents 1;

wherein the formula (5) is as follows:

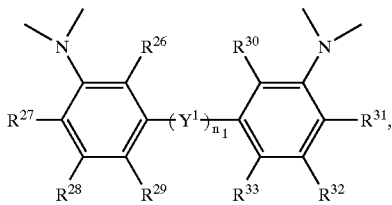

wherein at least one of $R^{26}$, $R^{27}$, $R^{28}$, $R^{29}$, $R^{30}$, $R^{31}$, $R^{32}$ and $R^{33}$ represents a monovalent organic group having a cis-diene-structure; the rest of $R^{26}$, $R^{27}$, $R^{28}$, $R^{29}$, $R^{30}$, $R^{31}$, $R^{32}$ and $R^{33}$ each independently represents a hydrogen atom, a hydroxyl group, a carboxyl group, an alkyl group having 1 to 20 carbon atoms or an alkoxy group having 1 to 20 carbon atoms; $Y^1$ represents oxygen, sulfur, an optionally substituted alkylene group having 1 to 4 carbon atoms, an optionally substituted alkylidene group having 1 to 4 carbon atoms or an optionally substituted alkyleneoxy group having 1 to 4 carbon atoms; and $n_1$ represents 0 or 1; and (b) forming fine patterns by crosslinking the cis-diene by oxidation polycondensation with singlet oxygen generated by exposure of the oxygen sensitizer to radiation.

24. The process according to claim 23, wherein the cis-diene structure is a structure of cyclopentadiene, furan, thiophene or pyrrole.

25. The process according to claim 24, wherein the oxygen sensitizer is a fullerene.

26. The process according to claim 23, wherein the oxygen sensitizer is a fullerene.

27. The process according to claim 23, wherein the cis-diene-substituted polyamic acid or polyimide has a structural unit of the formula (1).

28. The process according to claim 23, wherein the cis-diene-substituted polyamic acid or polyimide has a structural unit of the formula (2).

29. The process according to claim 23, wherein the cis-diene-substituted polyamic acid or polyimide has a structural unit of the formula (3).

30. The process according to claim 23, wherein the cis-diene-substituted polyamic acid or polyimide has a structural unit of the formula (4).

31. The process according to claim 23, wherein the cis-diene-substituted polyamic acid or polyimide has a structural unit of formula (5).

32. The process according to claim 31, wherein $Y^1$ is

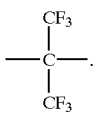

33. A process for producing a semiconductor device which comprises (a) coating a surface for forming a conductive circuit of a substrate on which semiconductor chips are disposed with a photosensitive resin composition which comprise (i) an oxygen sensitizer and (ii) a cis-diene-substituted polyamic acid or polyimide having a structural unit selected from the group consisting of a formula (1), a formula (2), a formula (3), a formula (4) and a formula (5), wherein the formula (1) is as follows:

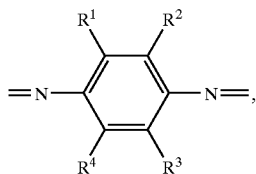

wherein at least one of $R^1$, $R^2$, $R^3$ and $R^4$ represents a monovalent organic group having a cis-diene structure; and the rest of $R^1$, $R^2$, $R^3$ and $R^4$ each independently represents a hydrogen atom, a hydroxyl group, a carboxyl group, an alkyl group having 1 to 20 carbon atoms or an alkoxy group having 1 to 20 carbon atoms;

wherein the formula (2) is as follows:

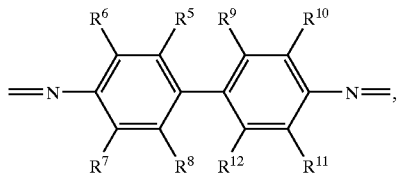

wherein at least one of $R^5$, $R^6$, $R^7$, $R^8$, $R^9$, $R^{10}$, $R^{11}$ and $R^{12}$ represents a monovalent organic group having a cis-diene-structure; and the rest of $R^5$, $R^6$, $R^7$, $R^8$, $R^9$, $R^{10}$, $R^{11}$ and $R^{12}$ each independently represents a hydrogen atom, a hydroxyl group, a carboxyl group, an alkyl group having 1 to 20 carbon atoms or an alkoxy group having 1 to 20 carbon atoms;

wherein the formula (3) is as follows:

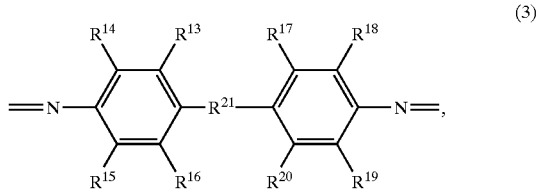

wherein at least one of $R^{13}$, $R^{14}$, $R^{15}$, $R^{16}$, $R^{17}$, $R^{18}$, $R^{19}$ and $R^{20}$ represents a monovalent organic group having a cis-diene-structure; and the rest of $R^{13}$, $R^{14}$, $R^{15}$, $R^{16}$, $R^{17}$, $R^{18}$, $R^{19}$, and $R^{20}$ each independently represents a hydrogen atom, a hydroxyl group, a carboxyl group, an alkyl group having 1 to 20 carbon atoms or an alkoxy group having 1 to 20 carbon atoms; and $R^{21}$ represents oxygen, sulfur, an alkylene group having 1 to 4 carbon atoms, an alkylidene group having 1 to 4 carbon atoms or an alkyleneoxy group having 1 to 4 carbon atoms;

wherein the formula (4) is as follows:

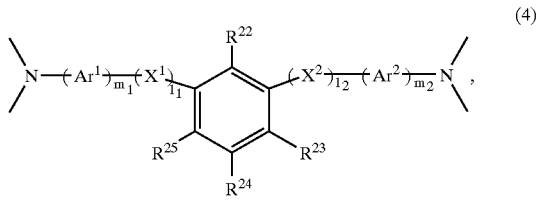

wherein at least one of $R^{22}$, $R^{23}$, $R^{24}$ and $R^{25}$ represents a monovalent organic group having a cis-diene-structure; the rest of $R^{22}$, $R^{23}$, $R^{24}$ and $R^{25}$ each independently represents a hydrogen atom, a hydroxyl group, a carboxyl group, an alkyl group having 1 to 20 carbon atoms or an alkoxy group having 1 to 20 carbon atoms; $X^1$ and $X^2$ each independently represents oxygen, sulfur, an alkylene group having 1 to 4 carbon atoms, an alkylidene group having 1 to 4 carbon atoms or an alkyleneoxy group having 1 to 4 carbon atoms; $Ar^1$ and $Ar^2$ each independently represents a divalent aromatic group; and $l_1$, $l_2$, $m_1$, and $m_2$ represents 1 when $l_2$ represents 1;

wherein the formula (5) is as follows:

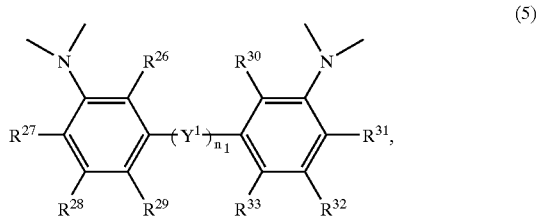

wherein at least one of $R^{26}$, $R^{27}$, $R^{28}$, $R^{29}$, $R^{30}$, $R^{31}$, $R^{32}$ and $R^{33}$ represents a monovalent organic group having a cis-diene-structure; the rest of $R^{26}$, $R^{27}$, $R^{28}$, $R^{29}$, $R^{30}$, $R^{31}$, $R^{32}$ and $R^{33}$ each independently represents a hydrogen atom, a hydroxyl group, a carboxyl group, an alkyl group having 1 to 20 carbon atoms or an alkoxy group having 1 to 20 carbon atoms; $Y^1$ represents oxygen, sulfur, an optionally substituted alkylene group having 1 to 4 carbon atoms, an optionally substituted alkylidene group having 1 to 4 carbon atoms or an optionally substituted alkyleneoxy group having 1 to 4 carbon atoms; and $n_1$ represents 0 or 1; and (b) forming fine patterns by crosslinking the cis-diene by oxidation polycondensation with singlet oxygen generated by exposure of the oxygen sensitizer to radiation.

34. The process according to claim 33, wherein the cis-diene structure is a structure of cyclopentadiene, furan, thiophene or pyrrole.

35. The process according to claim 34, wherein the oxygen sensitizer is a fullerene.

36. The process according to claim 33, wherein the oxygen sensitizer is a fullerene.

37. The process according to claim 33, wherein the cis-diene-substituted polyamic acid or polyimide has a structural unit of the formula (1).

38. The process according to claim 33, wherein the cis-diene-substituted polyamic acid or polyimide has a structural unit of the formula (2).

39. The process according to claim 33, wherein the cis-diene-substituted polyamic acid or polyimide has a structural unit of the formula (3).

40. The process according to claim 33, wherein the cis-diene-substituted polyamic acid or polyimide has a structural unit of the formula (4).

41. The process according to claim 33, wherein the cis-diene-substituted polyamic acid or polyimide has a structural unit of the formula (5).

42. The process according to claim 41, wherein $Y^1$ is

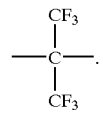

* * * * *